(12) United States Patent
Takahashi et al.

(10) Patent No.: US 7,049,687 B2
(45) Date of Patent: May 23, 2006

(54) TAPE CARRIER PACKAGE HAVING STACKED SEMICONDUCTOR ELEMENTS, AND SHORT AND LONG LEADS

(75) Inventors: Yoshikazu Takahashi, Tokyo (JP); Kaname Kobayashi, Yamanashi-ken (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/699,706

(22) Filed: Nov. 4, 2003

(65) Prior Publication Data

US 2004/0113271 A1  Jun. 17, 2004

Related U.S. Application Data

(62) Division of application No. 10/125,444, filed on Apr. 19, 2002, now Pat. No. 6,664,618.

(30) Foreign Application Priority Data

May 16, 2001 (JP) .............................. 2001-146111
Dec. 7, 2001 (JP) .............................. 2001-373524

(51) Int. Cl.
*H01L 23/495* (2006.01)
*H01L 23/06* (2006.01)
*H01L 23/02* (2006.01)
*H01L 23/34* (2006.01)
*H01L 23/28* (2006.01)

(52) U.S. Cl. ...................... 257/673; 257/686; 257/666; 257/786; 257/784; 257/685; 257/723; 257/777; 257/796; 257/684; 257/698; 257/696; 257/676; 257/773; 257/774; 257/783; 174/254; 174/261; 174/255; 29/846

(58) Field of Classification Search ............... 257/673, 257/686, 666, 685, 784, 786, 723, 777, 796, 257/684, 698, 696, 676, 773, 774, 783; 174/254, 174/261, 255; 29/846
See application file for complete search history.

(56) References Cited

U.S. PATENT DOCUMENTS

| | | | |
|---|---|---|---|
| 5,474,957 A * | 12/1995 | Urushima | 29/827 |
| 5,479,051 A | 12/1995 | Waki et al. | |
| 5,508,565 A | 4/1996 | Hatakeyama et al. | |
| 5,530,292 A | 6/1996 | Waki et al. | |
| 5,668,405 A * | 9/1997 | Yamashita | 257/668 |
| 5,777,387 A * | 7/1998 | Yamashita et al. | 257/737 |
| 5,786,239 A * | 7/1998 | Ohsawa et al. | 438/123 |
| 5,804,874 A | 9/1998 | An et al. | |
| 5,886,399 A * | 3/1999 | Ohsawa et al. | 257/668 |
| 5,949,134 A | 9/1999 | Yanagisawa | |
| 5,998,241 A * | 12/1999 | Niwa | 438/122 |
| 6,080,264 A | 6/2000 | Ball | |
| 6,087,718 A | 7/2000 | Cho | |
| 6,087,722 A | 7/2000 | Lee et al. | |
| 6,104,091 A * | 8/2000 | Ito et al. | 257/738 |

(Continued)

FOREIGN PATENT DOCUMENTS

JP  59-41845  *  3/1984 .................. 29/827

(Continued)

*Primary Examiner*—Alexander Oscar Williams
(74) *Attorney, Agent, or Firm*—Rabin & Berdo, PC

(57) ABSTRACT

A tape carrier in which a plurality of semiconductor elements can be mounted. The tape carrier includes a base tape on which device holes are formed and a plurality of leads provided on the base tape, wherein inner lead portions, which extend from the periphery of the device hole toward the center of the device hole, are of different lengths.

28 Claims, 16 Drawing Sheets

U.S. PATENT DOCUMENTS

| | | | |
|---|---|---|---|
| 6,194,778 B1 * | 2/2001 | Ohsawa et al. | 257/668 |
| 6,303,219 B1 * | 10/2001 | Sawamura et al. | 428/343 |
| 6,476,467 B1 | 11/2002 | Nakamura et al. | |
| 6,713,850 B1 * | 3/2004 | Yuan et al. | 257/668 |
| 2001/0054751 A1 | 12/2001 | Toyosawa | |
| 2002/0063331 A1 * | 5/2002 | Honda | 257/737 |
| 2002/0096781 A1 * | 7/2002 | Toyosawa | 257/777 |
| 2002/0117742 A1 | 8/2002 | Miyamoto et al. | |

FOREIGN PATENT DOCUMENTS

| | | | | |
|---|---|---|---|---|
| JP | 61-234538 | | 10/1986 | |
| JP | 62-195138 | * | 8/1987 | |
| JP | 63-4636 | * | 1/1988 | 257/723 |
| JP | 63-92034 | | 4/1988 | |
| JP | 63-124434 | | 5/1988 | |
| JP | 2-84347 | | 6/1990 | |
| JP | 04-025166 | | 1/1992 | |
| JP | 4-129252 | * | 4/1992 | 257/669 |
| JP | 05-021703 | | 1/1993 | |
| JP | 5-63034 | * | 3/1993 | |
| JP | 5-206216 | | 8/1993 | |
| JP | 6-181235 | | 6/1994 | |
| JP | 6-260530 | * | 9/1994 | |
| JP | 08-031866 | | 2/1996 | |
| JP | 08-148526 | | 6/1996 | |
| JP | 9-148482 | | 6/1997 | |
| JP | 11-040745 | | 2/1999 | |
| JP | 11-330347 | | 11/1999 | |
| JP | 2001-230368 | * | 8/2001 | |

* cited by examiner

TAPE CARRIER PACKAGE HAVING STACKED SEMICONDUCTOR ELEMENTS, AND SHORT AND LONG LEADS This is a Divisional of U.S. application Ser. No. 10/125,444, filed Apr. 19, 2002, now issued as U.S. Pat. No. 6,664,618.

BACKGROUND OF THE INVENTION

1. Field of the Invention

The present invention relates to a tape carrier package (TCP) which is a thin semiconductor device, a fabrication method thereof, and a tape carrier.

2. Description of the Related Art

A conventional IC packaging is used for protecting an IC body from external substances and mounting on a circuit board. In recent years, because IC products have an even wider range of applications, and material, size and configuration of packages have become diversified, and as the demand to mount a larger number of pins at an even higher density has increased, the demand to add higher values to the package itself has increased even more.

One such package configuration is a TOP (tape carrier package). A tape carrier herein is a semiconductor device fabricated in the following manner. A device hole is first formed in a flexible base tape, leads (wiring patterns) are formed by, for example, photolithography, and then a solder resist is formed to protect the leads. The TCP is a package in which semiconductor elements are mounted on the tape carrier and sealed by, for example, a resin. A package in which semiconductor element(s) are mounted on a tape carrier but are not sealed by a molding is referred to as a structure.

In a conventional tape carrier, on a photographic film-like base tape made of, for example, polyimide, device holes are formed along the longitudinal direction of the base tape. Many sprocket holes are provided in the vicinity of and along the both width direction edges of the base tape so as to be parallel to the device holes, to facilitate conveyance of the base tape during manufacturing thereof, or the like. A plurality of leads is formed as inner lead portions which protrude toward each device hole. These leads are generally formed of a conductive metal, such as aluminum, copper, or the like. A solder resist is formed on the leads to protect the wiring pattern at a portion of the leads that are on the base tape. The entire surface of each of the leads is plated with Sn (tin), Au (gold), solder, or the like for protection and for bonding the leads.

To mount semiconductor elements on the tape carrier, the semiconductor elements are bonded to the inner lead portions by, for example, eutectic reaction or thermo-compression. Then, a mold is formed by a resin, or the like. Finally, the base tape is cut out to form each package. The package is surface mounted on, for example, a printed wiring board by bonding outer lead portions thereof to the printed wiring board.

A conventional TCP is shown in FIGS. 15A and 15B. FIG. 15A is a plan view of the conventional TCP and FIG. 15B is a sectional view of the conventional TCP taken along line C–C' of FIG. 15A. A base film 101 is made of, for example, polyimide. Sprocket holes 102 are formed on the base film 101 for conveyance of the base film 101. A semiconductor element 110 includes protruding electrodes 111 which are connected to terminals 103 via inner lead portions 105. The terminals 103 are connected to external circuits. The inner lead portions 105 and the terminals 103 are made of copper, formed by etching and plated with Sn, Au, or solder. The terminals 103 are wider than the inner lead portions. 105. A solder resist 106 is formed on the inner lead portions 105 to protect the copper-made pattern except the terminals 103. A sealing resin 112 is provided to cover and protect the semiconductor element 110 and the inner lead portions 105.

Another conventional TCP is shown in FIGS. 16A and 16B, which is disclosed in Japanese Patent Application Laid-Open (JP-A) No. 5-21703. FIG. 16A is a plan view of an IC package and FIG. 16B is a sectional view taken along line C–C' of FIG. 16A. This TCP is fabricated in the following manner. Device holes 104 are formed on a tape base 102. Leads 108 are provided on the tape base 102 at the periphery of the device hole 104. Several semiconductor chips 106 are stacked in the device hole 104. Tips of the leads 108 are formed as inner lead portions 108a, which are connected to bumps 110 disposed on the semiconductor chips 106. Then, the semiconductor chips 106 and the device hole 14 are sealed by, for example, a sealing resin 112. This conventional structure has drawbacks in that, because the semiconductor chips 106 are stacked with chip surfaces on which leads 108 are to be bonded facing each other, it is necessary to overturn the package during bonding of the leads 108. Further, because only the leads extending in opposed two directions are connected to each semiconductor chip 106, there are limits to increasing packaging density of semiconductor chips.

For several years, an IC package, known as a BGA (i.e., ball grid array) package which can be mounted at a high density on a printed wiring board, has been developed. In the BGA package, metal balls for connecting to external circuits are disposed in a grid-like pattern at the bottom of the IC package. In this configuration, because terminals for external connection are disposed in a two-dimensional plane, the number of pins can be increased without changing the dimensions of the package very much.

FIGS. 17A and 17B illustrate a BGA structure disclosed in JP-A No. 8-148526, which uses a tape carrier. FIG. 17A is a sectional elevation view, and FIG. 17B is a bottom view, of a BGA type IC package. The BGA semiconductor device has excellent moisture resistance property, and can be fabricated at a low cost, and can be produced in large quantities. In the BGA semiconductor device, a device hole 102a is formed in the center of a flexible resin substrate made of, for example, polyimide film. Leads 103 formed of a copper foil are provided at a surface of the substrate, and the substrate is used as a TCP substrate. Tips of the leads 103 are formed as inner lead portions 103a, which are connected to electrodes 101a of a semiconductor chip 101. Each lead 103 is connected to a corresponding bump 105, such as a solder ball disposed at the bottom surface of the package.

In such conventional tape carriers, only one semiconductor element can be mounted on a single tape carrier, and it is difficult to mount several semiconductor elements, particularly semiconductor elements having different sizes, on a single tape carrier at a high density to improve functions of the semiconductor package.

In the package configuration which employs a combination of the tape carrier and the BGA, a larger number of external terminals may be extended from a package of the same size as those of conventional ones. However, it is very difficult to improve functions of the package itself by densely mounting several semiconductor elements on a single tape carrier.

SUMMARY OF THE INVENTION

In view of the aforementioned, an object of the present invention is to improve functions of and to add further values to a semiconductor package by mounting several semiconductor elements (particularly semiconductor elements of different sizes) in a single device hole of a tape carrier without losing TCP advantages of being compact and thin.

A semiconductor package of the present invention comprises: a tape carrier; a first semiconductor element having a surface and a first electrode, on which surface the first electrode is provided; a longer lead which is provided on the tape carrier and connected to the first electrode; a second semiconductor element having a surface and a second electrode, on which surface the second electrode is provided, and the first semiconductor element is stacked; a shorter lead which is provided on the tape carrier and connected to the second electrode and is shorter than the longer lead; and a resin material which seals the first semiconductor element, the second semiconductor element, the longer lead and the shorter lead.

In this structure, two semiconductor elements can be stacked and accommodated in a single TCP and the semiconductor device can be made thinner. Therefore, functions of the TCP can be improved and higher values can be added to the TCP.

Another semiconductor package comprises: a tape carrier; a first semiconductor element having a surface and a first electrode, on which surface the first electrode is provided; a longer lead having two ends and a first land, the one end being connected to the first electrode and the other end forming the first land on the tape carrier; a second semiconductor element having a surface and a second electrode, on which surface the second electrode is provided, and the first semiconductor element is stacked; a shorter lead having two ends and a second land, the one end being connected to the second electrode and the other end forming a second land on the tape carrier; a resin material which seals the first semiconductor element, the second semiconductor element, the longer lead and the shorter lead; and solder balls, which are mounted on the first and second lands for external connection.

In this structure, since the TCP employs the BGA structure, the TCP can be solder-mounted on a circuit board with other parts at the same time by reflowing solder.

The present invention further includes at least another longer lead and at least another shorter lead, wherein each of the longer leads and each of the shorter leads are arranged so as to alternate with each other.

In this structure, because a plurality of first and second electrodes and a plurality of longer and shorter leads are provided, and each of the longer leads and each of the shorter leads are arranged alternately adjacent to each other, the upper and the lower semiconductor elements can be easily connected.

The second semiconductor element is larger than the first semiconductor element, and comprises a surface area that faces the first semiconductor element and the second electrode is disposed outside the area.

The first semiconductor element includes a first surface, on which the first electrode is formed, and a second surface, which is opposite the first surface; the second semiconductor element includes a third surface, on which the second electrode is formed, and a fourth surface, which is opposite the third surface; and the first semiconductor element and the second semiconductor element are stacked such that the second surface faces the third surface.

In this structure, the lower semiconductor element is larger than the upper semiconductor element, and the electrode of the lower semiconductor element is disposed outside the area overlapping the upper semiconductor element. Therefore, the upper and the lower semiconductor elements can be stacked such that the surfaces having the electrodes thereon face the same direction. Accordingly, it is unnecessary to overturn the package during bonding of the inner lead portions to the electrodes as in the case of conventional package.

Further, the fourth surface is substantially devoid of the resin material, and the resin material is applied to substantially the remainder of the package.

Accordingly, since no resin material is applied to the bottom surface of the lower semiconductor element, the package on the whole can be thinner.

The first and the second semiconductor elements are adhered to each other.

In this structure, each of the lower and the upper semiconductor elements has two sets of edges which are substantially parallel to each other, and each of the longer and the shorter leads extends orthogonally to each edge. Accordingly, the leads are arranged regularly and the TCP can be made compact.

The longer and the shorter leads extend outwardly in the substantially same plane. The first and the second semiconductor elements are bonded together using an adhesive.

Such a structure makes it easy to mount the TCP on the circuit board.

Further, to overcome the disadvantages of the prior art, a tape carrier of the present invention includes: a base tape having a device hole formed therein; and a plurality of leads provided on the base tape, wherein inner lead portions of the leads which extend from the periphery of the device hole toward the center of the device hole have several different lengths.

In this structure, several semiconductor elements of different sizes can be mounted in a single device hole of the tape carrier. Therefore, functions of the TCP can be improved and higher values can be added to the TCP without losing TCP advantages of being compact and thin.

Further, in the present invention, surfaces of several semiconductor elements are spaced apart from one another. Therefore, mutual interference between one semiconductor element and other semiconductor elements resulting from noise, or the like, generated by the other semiconductor elements can be reduced. Accordingly, improper operations of the semiconductor elements can be prevented while achieving aforementioned objects.

In the present invention, because BGA is employed at the external connection terminals of the outer lead portion, the arrangement of the leads can be determined freely. Therefore, the number of degrees of freedom in the arranging of the terminals which output signals of the mounted semiconductor element and designing of the device using the TCP increases. Accordingly, the synergy between the TCP and the BGA helps to improve functions of the TCP, to integrate an increased number of chips, and to add higher values to the TCP in the same mounting area, without losing the TCP advantages of being compact and thin. By stacking several TCPs of BGA type, output and input terminals of two or more tape carriers can be connected to a mount substrate in a mount area of a single tape carrier. Moreover, because semiconductor elements mounted on a tape carrier can be

DETAILED DESCRIPTION OF THE PREFERRED EMBODIMENTS

Hereinafter, embodiments of the present invention will be described with reference to the drawings.

First Embodiment

Figure 1A:
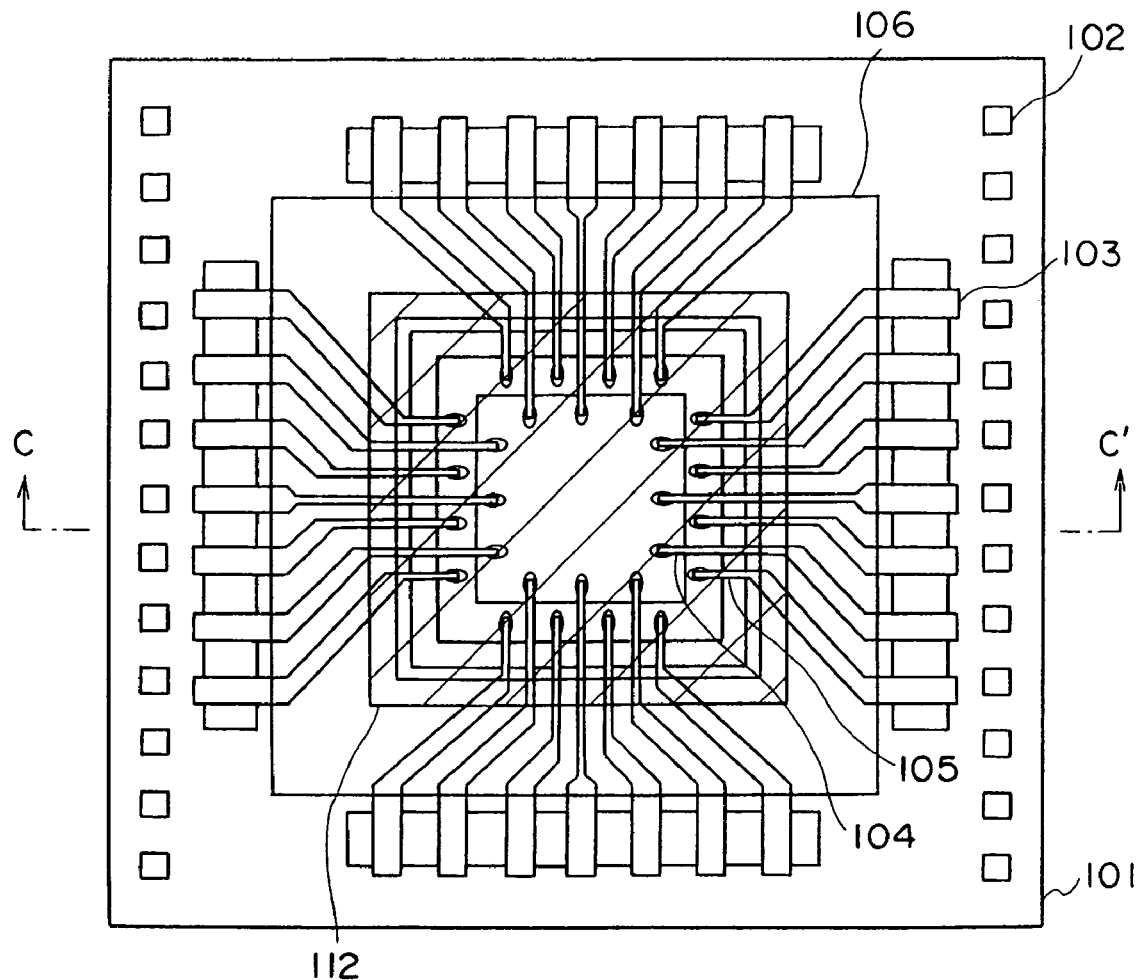
FIG. 1A is a plan view of a TCP of a first embodiment of the present invention.
Figure 1B:
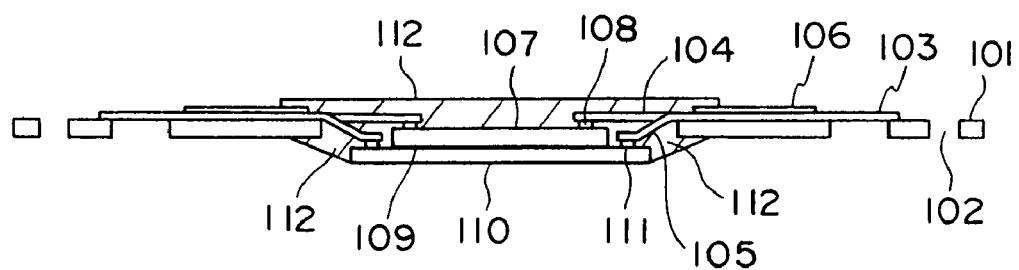
FIG. 1B is a sectional view taken along line C–C' of FIG. 1A.

FIGS. 1A and 1B illustrate a first embodiment of the present invention. FIG. 1A is a plan view showing a TCP of the first embodiment of the present invention and FIG. 1B is a sectional view of FIG. 1A taken along line C–C'.

A base film 101 is made of a polyimide, for example. Sprocket holes 102 are formed on the base film 101 to convey the same. Protruding electrodes 111 are provided on a lower semiconductor element 110. The electrodes 111 are connected to terminals 103 via inner lead portions 105. Protruding electrodes 108 are provided on an upper semiconductor element 107. The electrodes 108 are connected to other terminals 103 via inner lead portions 104. The terminals 103 are connected to external substrates. The width of the inner lead portion 104 or 105 decreases at the portion where it is connected to the electrode 108 or 111 to make space between adjacent leads. The inner lead portion 105 is shorter than the inner lead portion 104. The upper and the lower semiconductor elements 107 and 110 are substantially square-shaped, and the upper semiconductor element 107 is smaller than the lower semiconductor element 110. The tape carrier of the present embodiment may be applied to upper and lower semiconductor elements 107 and 110 of any shape, such as rectangular, by changing an arrangement of the inner lead portions formed on the base film 101. The upper semiconductor element 107 is stacked on and adhered to the lower semiconductor element 110 using an adhesive 109.

The electrodes 108 and 111 are disposed along each of four edges of the upper or lower semiconductor element 107 or 110. The electrodes 111 are spaced apart from the peripheral edges of the upper semiconductor element 107, whereby the upper semiconductor element 110 does not inhibit bonding of the inner lead portions 104 to the electrodes 111 of the lower semiconductor element 110. The upper semiconductor element 107 is aligned with the lower semiconductor element 110 so that corresponding edges of the two semiconductor elements 107 and 110 are parallel to each other, and, at the same time, each electrode 108 of the upper semiconductor element 107 is disposed between the adjacent electrodes 111 of the lower semiconductor element 110. The inner lead portions 104 and 105 are connected to the electrodes 108 and 111, respectively. Each inner lead portion 104 is disposed between the adjacent inner lead portions 105, i.e., the inner lead portion 104 and the inner lead portion 105 are disposed alternately. However, arrangement of the inner lead portions 104 and 105 is not limited to the above manner. For example, of the leads extending in one direction, several inner lead portions 104 may be disposed successively, and, subsequently, several inner lead portions 105 may be disposed successively. Further, the four groups of the leads extending in each of the four directions may only include one of inner lead portions 104 or 105.

End portions of the inner lead portions 104 and 105, which are opposite to the end portions where the inner lead portions 104 and 105 are connected to the electrodes 108 and 111, are formed as the terminals 103. The terminals 103 are connected to external circuits. The base film has a common hole formed at an edge thereof. The ends of the lead portions terminate at this common hole. The terminals 103 and the inner lead portions 104 and 105 are plated with Sn, Au or solder. These copper wiring patterns composed of the inner lead portions 104 and 105 are nipped between a solder resist 106 and the base film 101 and shielded from the outside. A sealing resin 112 seals the whole of upper semiconductor element 107, side surfaces of the lower semiconductor element 110, the inner lead portions 104 and 105, a part of the solder resist 106 and a part of the base film 101 to protect the whole package. In this structure, because the bottom surface of the lower semiconductor element 110 is not covered with the sealing resin 112, the TCP on the whole can be made thinner than conventional TCPs.

Second Embodiment

Figure 2A:
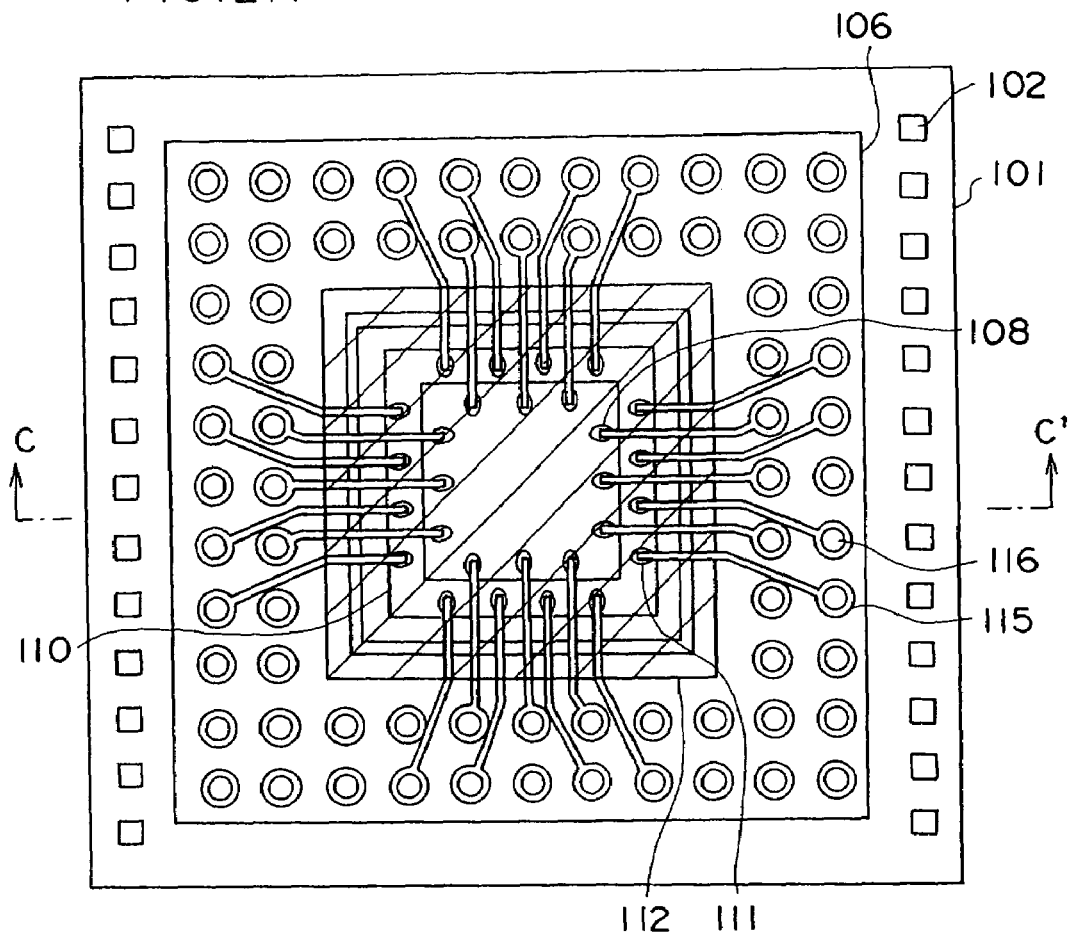
FIG. 2A is a plan view of a TCP of a second embodiment of the present invention.
Figure 2B:
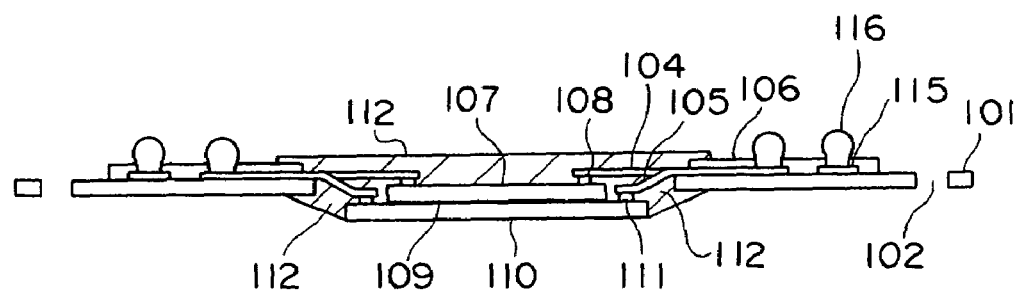
FIG. 2B is a sectional view taken along line C–C' of FIG. 2A.

FIGS. 2A and 2B illustrate a second embodiment of the present invention, which employs a BGA structure. In the BGA structure of FIGS. 2A and 2B, the terminal which is connected to an external circuit is embodied as a land 115 on which a metal ball, such as a solder ball, is disposed. FIG. 2A is a plan view of a TCP of the second embodiment and FIG. 2B is a sectional view taken along line C–C1 of FIG. 2A. A base film 101 is made of, for example, polyimide. Sprocket holes 102 are formed on the base film 101 to convey the same. As in the case of the first embodiment, the upper and the lower semiconductor elements 107 and 110 are substantially square-shaped, and the upper semiconductor element 107 is smaller than the lower semiconductor element 110. The tape carrier of the present embodiment may be applied to upper and lower semiconductor elements 107 and 110 of any shape, such as rectangular, by changing the arrangement of the inner lead portions formed on the base film 101. The upper semiconductor element 107 is aligned with the lower semiconductor element 110 so that corresponding edges of the two semiconductor elements 107 and 110 are parallel to each other. The upper semiconductor element 107 is stacked on and adhered to the lower semiconductor element 110 using an adhesive 109. The inner lead portion 105 is shorter than the inner lead portion 104.

Each of the inner lead portions 104 and 105 is connected to a corresponding land 115 and connected to an external circuit via the land 115. The lands 115 are disposed in a grid pattern on a surface of the base film 101 to surround the stacked structure of the upper and the lower semiconductor elements 107 and 110. On each land 115, a metal ball 116, such as a solder ball, is disposed through which the package is connected to external circuits. The metal balls 116 protrude from the surface of a sealing resin 112. In this configuration, because the lands 115 for external connection are disposed in a two-dimensional plane, the number of pins can be increased without changing the dimensions of the package very much. The land 115, the inner lead portions 104 and 105 are made of copper and plated with Sn, Au or solder.

The electrodes 108 and 111 are disposed along each of four edges of the upper and lower semiconductor elements 107 and 110, respectively. The electrodes 111 are spaced apart from the peripheral edges of the upper semiconductor element 107, whereby the upper semiconductor element 107 does not inhibit bonding of the inner lead portions 104 and 105.

Each inner lead 104 is disposed between the adjacent inner lead portions 105. The land-side end portions of the inner lead portions 104 and 105, which are opposite to the end portions where the inner lead portions 104 and 105 are connected to the electrodes 108 and 111, are formed as the terminals for being connected to external circuits. The inner lead portions 104 and 105, which are made of copper, are nipped between a solder resist 106 and the base film 101 and shielded from the outside. A sealing resin 112 seals the whole of the upper semiconductor element 107, side surfaces of the lower semiconductor element 110, the inner lead portions 104 and 105, a part of the solder resist 106 and a part of the base film 101 to protect the whole of package. As in the case of the first embodiment, the bottom surface of the lower semiconductor element 110 is not covered with the sealing resin 112. Accordingly, the TCP of the present embodiment has the advantage that it can be made thinner since no sealing resin is applied to the bottom surface.

Third Embodiment

Figure 3A:
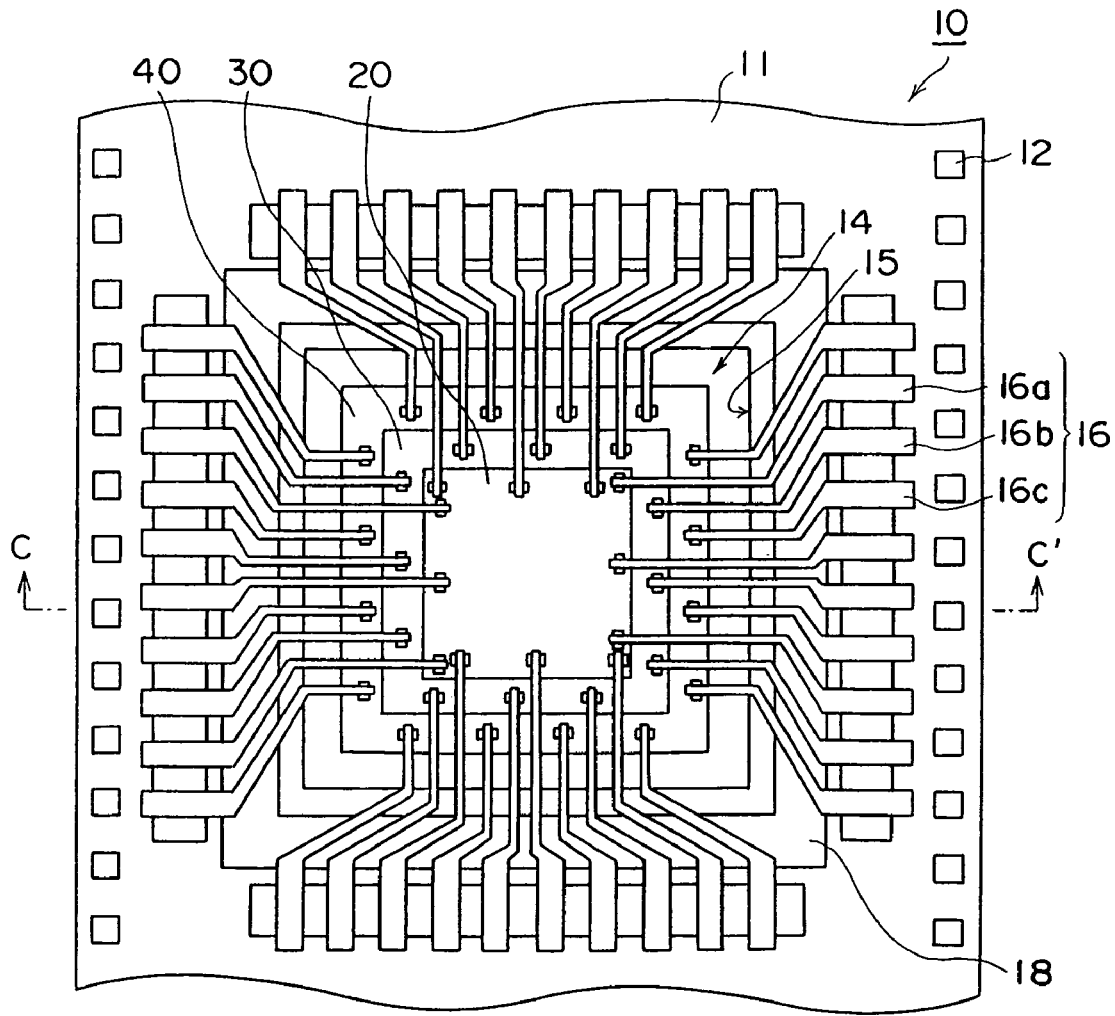
FIG. 3A is a plan view of a TCP of a third embodiment of the present invention.
Figure 3B:
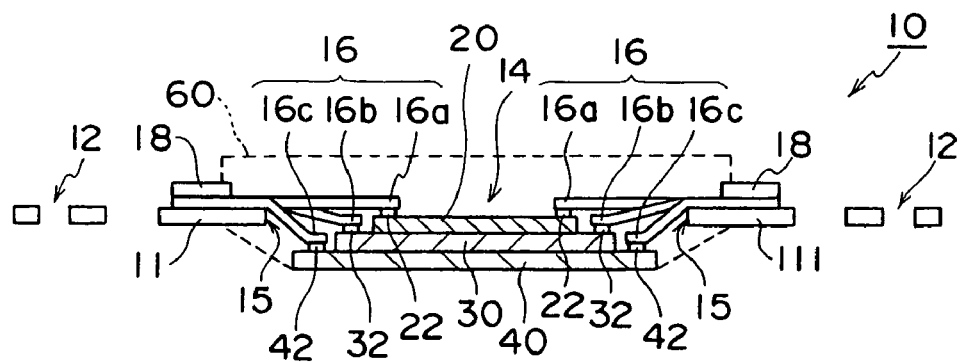
FIG. 3B is a sectional view taken along line C–C' of FIG. 3A.

FIGS. 3A and 3B schematically illustrate a third embodiment of the present invention. FIG. 3A is a plan view schematically illustrating a TCP structure having three semiconductor elements mounted on a tape carrier. FIG. 3B is a sectional view taken along line C–C' of FIG. 3A and seen from the direction indicated by arrows.

Hereinafter, the third embodiment of the present invention will be described with reference to FIGS. 3A and 3B. A tape carrier 10 of the present embodiment is formed by an elongated base tape 11 which includes a plurality of device holes 14. Sprocket holes 12 are formed on the base tape 11 to convey the same. Several sets of leads 16 are disposed regularly along each of the four peripheral edges 15 of the device hole 14. Each set of leads 16 is composed of three leads including inner lead portions of three different lengths, i.e., a first lead 16a, a second lead 16b which is shorter than the first lead 16a, and a third lead 16c which is shorter than the second lead 16b, which are basically arranged in this order. Here, the leads 16a, 16b and 16c are distinguished by the lengths of the inner lead portions thereof, rather than the overall lengths (the same applies to the following embodiments). As shown in FIG. 3A, in the present embodiment, three sets of leads 16 are disposed along each of the four peripheral edges 15 of the device hole 14. A third lead 16c is added at the right end of the three sets of the leads 16. The inner lead portion, as used herein, means a portion of the inner lead portion 16 extending from the device hole edge 15 into the device hole 14.

A solder resist 18 covers and protects portions of the leads 16, which portions are disposed on the base tape 11.

Although the solder resist 18 actually covers the leads 16, only outlines of the solder resist 18 are shown in FIG. 3A to make this drawing of the arrangement of the leads 16 simple and easy to understand (the same applies to the following drawings).

The inner lead portion lengths of the first, second and third leads 16a, 16b and 16c are separately decided based on the size and the thickness of the semiconductor element which is to be bonded to each inner lead portion, and based on the electrode arrangement for bonding with the inner lead portion (which will be described in detail later).

Three semiconductor elements, i.e., a first semiconductor element 20, a second semiconductor element 30 and a third semiconductor element 40, are mounted in the device hole 14. First protruding electrodes 22, which are used as bonding pads, are disposed on an upper surface of the first semiconductor element 20 along the edges thereof. Second protruding electrodes 32 are disposed on an upper surface of the second semiconductor element 30 along the edges thereof. Third protruding electrodes 42 are disposed on an upper surface of the third semiconductor element 40 along the edges thereof.

Each of the first, second and third semiconductor elements 20, 30 and 40 has a rectangular-parallelepiped shape and the shapes of the upper surfaces of which are similar to one another. The thickness of the three semiconductor elements is identical. The dimensions of the upper surface of the first semiconductor element 20 are the smallest of the three, the dimensions of the upper surface of the second semiconductor element 30 are larger than those of the first semiconductor element 20, and the dimensions of the upper surface of the third semiconductor element 40 are the largest of the three. These three semiconductor elements 20, 30 and 40 are disposed on the tape carrier 10 so as to form a stepped-pyramidal shape.

It is preferable to adhere the semiconductor elements mounted on the tape carrier 10 (the first semiconductor element 20, the second semiconductor element 30 and the third semiconductor element 40 in the present embodiment) to one another using an adhesive (not shown) to minimize the thickness of the TCP, as long as functions of the semiconductor elements are not impaired and the semiconductor elements can be stacked with enough area left for the bonding pads. For example, the bottom surface of the first semiconductor element 20 is adhered to the upper surface of the second semiconductor element 30, and the bottom surface of the second semiconductor element 30 is adhered to the upper surface of the third semiconductor element 40 using the adhesive. However, the semiconductor elements may also be disposed in a mold 60, with spaces left between adjacent semiconductor elements to prevent operation malfunctions of the semiconductor elements resulting from, for example, mutual interference among the semiconductor elements due to noise, or the like, generated by the semiconductor elements.

A lower surface of the end portion of the first lead 16a is bonded to the bonding pad, i.e., the first protruding electrode 22 on the first semiconductor element 20. A lower surface of the end portion of the second lead 16b is bonded to the second protruding electrode 32 on the second semiconductor element 30. A lower surface of the end portion of the third lead 16c is bonded to the third protruding electrode 42 on the third semiconductor element 40.

In the third embodiment, in a case in which three semiconductor elements are to be mounted, several sets of the inner lead portions having the three different lengths are disposed regularly and parallel to one another on the tape carrier. However, by altering, for example, the arrangement of the semiconductor elements, the number of semiconductor elements to be mounted can be larger than the number of the lengths of the inner lead portions in each set.

Accordingly, the present invention is a tape carrier and a TCP employing the same, the tape carrier including sets of inner lead portions having two or more different lengths, and the number of semiconductor elements to be mounted being equal to or more than the number of the inner lead portion lengths.

As described above, by preparing inner lead portions having different lengths based on the number or the size of the semiconductor elements to be mounted, the arrangement of the bonding pad, or the like, two or more semiconductor elements, especially of different sizes, can be easily mounted on a single tape carrier. Therefore, functions of the TCP can be improved and higher values can be added to the TCP within the same mounting area as those of conventional TCPs.

Because the first semiconductor element 20 is placed on the top of the stacked semiconductor elements, the protruding electrodes 22 may be disposed at any positions on the first semiconductor element 20 as long as the first leads 16a of the tape carrier 10 can be bonded thereto. However, in the case in which several semiconductor elements are adhesively stacked, positions of the second protruding electrodes 32 on the upper surface of the second semiconductor element 30 must be decided so that the first semiconductor element 20 and the second leads 16b which are bonded on the second protruding electrodes 32 do not form short circuits, and that the second protruding electrodes 32 on the second semiconductor element 30 and the first protruding electrodes 22 on the first semiconductor element 20 are physically and electrically spaced apart from each other. But this does not apply to a case in which the semiconductor elements are not adhered to and are spaced apart from one another. Positioning of the third protruding electrodes 42 on the surface of the third semiconductor element 40 is similar to that of the second protruding electrodes 32.

Generally, the semiconductor elements are offset downwardly from the plane of the tape carrier when bonded to the inner lead portions, to prevent short circuits formed between leads from occurring.

In a case in which the tape carrier of the present invention is produced using prefabricated semiconductor elements, the lengths of the inner lead portions are determined based on the following conditions: the size and thickness of the semiconductor elements to be bonded to the inner lead portions, the margin of the inner lead portion required for a desired offset, and the like. It is preferable to determine the thickness of the completed package as a whole so that no malfunctions will occur when the package is mounted on, for example, a printed wiring board, without impairing the characteristics of the TCP, such that they can be made thin and compact.

It is preferable to set the lengths of the inner lead portions as short as possible within the range of the above-described conditions to prevent short circuits from being formed between the inner lead portions. The widths of the end portions of the inner lead portions are preferably set as wide as possible to make it easier to bond the inner lead portions to the bonding pads of the semiconductor elements.

In the third embodiment and in the following embodiments, any materials may be employed as the base tape as long as they meet the object of the present invention.

Though the device hole 14 and the surfaces of the semiconductor elements in the third embodiment are rectangular-shaped, the configuration of the present invention sets no limits on the shapes of the device hole 14 and the semiconductor elements. They may also be circular or elliptical-shaped (the same applies to the following embodiments).

Though the semiconductor elements mounted on the tape carrier 10 are of the same thickness in the third embodiment, semiconductor elements of different thicknesses may also be employed as long as the objects of the present invention are accomplished (the same applies to the following embodiments).

In the third embodiment, the upper surfaces of the semiconductor elements mounted on the tape carrier 10 are all rectangular-shaped. However, the upper surfaces of the first, second and third semiconductor elements 20, 30 and 40 may be of different shapes as long as their own functions are not impaired (the same applies to the following embodiments).

In the present embodiment, the structure of the tape carrier (especially the inner lead portions) are designed based on the structure of the semiconductor elements. However, electrodes on the semiconductor elements may be optimally arranged to be suited for a tape carrier which includes sets of inner lead portions of several lengths.

The semiconductor elements and the inner lead portions, after bonded to each other, are sealed by a mold 60 formed of resin, or the like. In a case in which a thermosetting adhesive is applied to the semiconductor elements, the adhesive is hardened by the heat applied when the mold 60 is formed (the same applies to the following embodiments).

In the tape carrier structure of the third embodiment, the semiconductor elements having different sizes may be mounted at the single device hole. Therefore, functions of the TCP can be even further improved and even higher values can be added to the TCP within the same mounting area as those of conventional TCPs without sacrificing advantages of a TCP that is compact and thin.

Next, referring to FIGS. 3A and 3B, an example of fabrication method of the tape carrier and the TCP of the present invention will be explained.

First, the sprocket holes 12 and the device holes 14 are formed on the flexible base tape 11 which is formed of a polyimide film, a polyester film or the like. These holes are preferably formed mechanically with a mold, a puncher, or the like.

The upper surface of the base tape 11 is laminated with copper foil. Thereafter, the lengths, widths, arrangements, and the like, of the inner lead portions are decided based on the size of the semiconductor elements, electrode arrangements, positions of the semiconductor elements in the package, and the like. Then, according to the above conditions, a plurality of leads 16 is formed through a photo-resist forming process, an etching process, or the like.

Thereafter, all of the exposed surfaces of the leads 16 are plated with metal, such as Au, Sn, solder, or the like, to facilitate bonding to the semiconductor elements and to protect the leads. Finally, the solder resist 18 is formed on the upper surface of the base tape 11 to protect the leads 16 for an area of the leads 16, which area is on the base tape 11. In this manner, the tape carrier 10 of the present invention is fabricated.

Next, a fabrication method of the TCP will be explained. The semiconductor elements are generally bonded to the tape carrier 10 by the eutectic reaction or the thermo-compression between the metal plating material plated on the leads 16 and the bonding pads, or the like, disposed on the semiconductor elements. To explain in more detail, the metal plating material which is applied to at least upper surface, and optionally, the lower and/or side surfaces (one or both of the side surfaces) is melted to be bonded to the bonding pads of the semiconductor elements by the eutectic reaction or the thermo-compression.

Each of the first leads 16a and the corresponding first protruding electrode 22 of the first semiconductor element 20 are aligned and bonded to each other using a bonding device. Then, each of the second leads 16b and the corresponding second protruding electrode 32 of the second semiconductor element 30 are aligned with and bonded to each other using the bonding device. When the leads and the electrodes are aligned with each other, an adhesive, or the like, may be applied in advance to the lower surface of the first semiconductor element 20 to adhere the first semiconductor element 20 to the second semiconductor element 30. The third semiconductor element 40 is bonded to the third leads 16c in a similar manner. If desired, the adhesive, or the like, may be applied to the lower surface of the second semiconductor element 30 to adhere the second semiconductor element 30 to the third semiconductor element 40, so that the three semiconductor elements are adhered to one another. If four or more of the semiconductor elements are to be mounted on the tape carrier of the present invention, the same processing may be employed in principle. In this manner, the structure shown in FIGS. 3A and 3B is obtained.

Finally, the mounted semiconductor elements and the inner lead portions are sealed by a mold 60 formed of resin, or the like. At this time, in consideration of a heat dissipation property of the semiconductor elements, cost performance optimization resulting from savings of molding material, and the like, surfaces of one or more of the mounted semiconductor elements may be exposed. If semiconductor elements of different widths are mounted, surfaces of one or more of the semiconductor elements may be exposed in accordance with the total thickness of the stacked semiconductor elements.

Fourth Embodiment

Figure 4A:
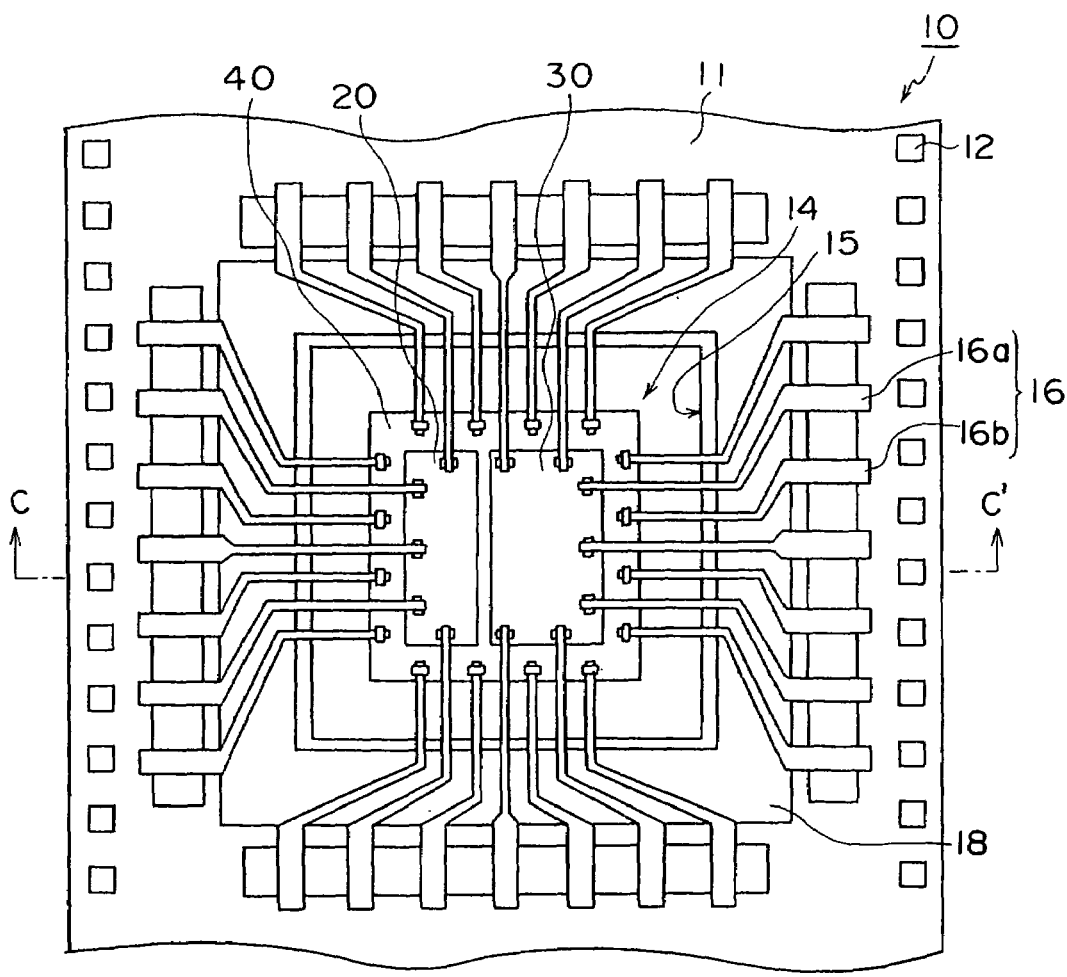
FIG. 4A is a plan view of a TCP of a fourth embodiment of the present invention.
Figure 4B:
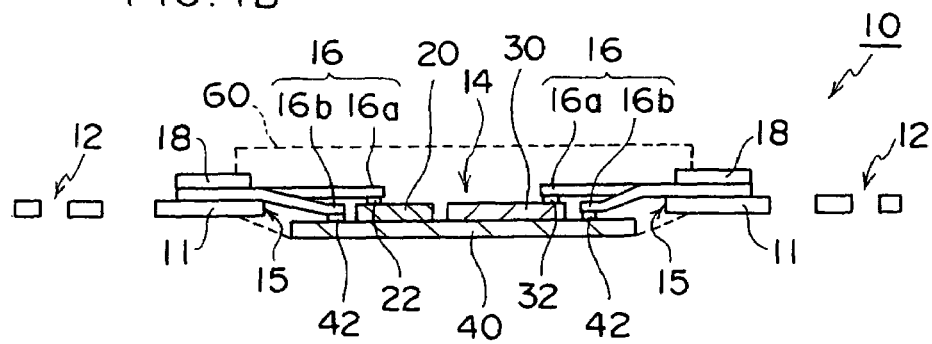
FIG. 4B is a sectional view taken along line C–C' of FIG. 4A.

FIGS. 4A and 4B schematically illustrate a fourth embodiment of the present invention. FIG. 4A is a plan view schematically illustrating a TCP structure having three semiconductor elements which are mounted in another arrangement on a tape carrier 10. FIG. 4B is a sectional view taken along line C–C' of FIG. 4A and seen from the direction indicated by arrows.

Hereinafter, the fourth embodiment of the present invention will be described with reference to FIGS. 4A and 4B. The tape carrier 10 of the fourth embodiment differs from that of the third embodiment in that the tape carrier 10 of the fourth embodiment comprises the sets of leads 16, each set being composed of two leads including inner lead portions of two different lengths, i.e., the first lead 16a and the second lead 16b, which is shorter than the first lead 16a. Several sets of leads 16 are disposed parallel to one another on the base tape 11. As shown in FIG. 4A, two sets of leads 16 are disposed along each of the four peripheral edges 15 of the device hole 14. A second lead 16b is added at the right end of the two sets of the leads 16. Several sets of leads 16 are disposed parallel to one another so as to extend from the device hole edge 15 into the device hole 14.

Three semiconductor elements, i.e., the first semiconductor element 20, the second semiconductor element 30 and the third semiconductor element 40, are mounted at the device hole 14. The first protruding electrodes 22 are disposed on the upper surface of the first semiconductor element 20. The second protruding electrodes 32 are disposed on the upper surface of the second semiconductor element 30. The third protruding electrodes 42 are disposed on the upper surface of the third semiconductor element 40. Thus, the three semiconductor elements are oriented in the same direction in regard to the positions where the protruding electrodes are disposed.

Each of the first, second and third semiconductor elements 20, 30 and 40 has a rectangular-parallelepiped shape. The upper and the lower surfaces of the third semiconductor element 40 are of identical square-shaped. The thickness of the three semiconductor elements is identical. The dimensions of the upper surface of the first semiconductor element 20 are the smallest of the three, the dimensions of the upper surface of the second semiconductor element 30 are larger than those of the first semiconductor element 20, and the dimensions of the upper surface of the third semiconductor element 40 are the largest of the three. The length of the longer sides of the upper surface of the first semiconductor element 20 is equal to the length of the longer sides of the upper surface of the second semiconductor elements 30. The total length of a shorter side of the upper surface of the first semiconductor element 20 and a shorter side of the upper surface of the second semiconductor element 30 is smaller than the length of the longer sides of the upper surface of the second semiconductor element 30 or than the length of an outer peripheral edge of the upper surface of the third semiconductor element 40. The first and second semiconductor elements 20 and 30 are disposed in parallel with the longer sides facing each other. In the present embodiment, the first and the second semiconductor elements 20 and 30 are mounted on the upper surface side of the third semiconductor element 40 so that their own functions are not impaired. That is, the first and the second semiconductor elements 20 and 30 are mounted so as not to impair the functions of the bonding pads, the protruding electrodes, or the like, disposed on the third semiconductor element 40. Here, it is preferable to adhere these three semiconductor elements to one another using an adhesive (not shown) to minimize the TCP thickness. That is, it is preferable to adhere the bottom surfaces of the first and the second semiconductor elements 20 and 30 to the upper surface of the third semiconductor element 40.

The first leads 16a are bonded to the protruding electrodes 22 on the first semiconductor element 20 and the protruding electrodes 32 on the second semiconductor element 30. The second leads 16b are bonded to the protruding electrodes 42 on the third semiconductor elements 40.

Because the fabrication methods of the tape carrier 10 and the TCP of the present embodiment are substantially the same as those of the third embodiment, explanation thereof will be omitted.

According to the fourth embodiment of the present invention, three semiconductor elements may be mounted on a tape carrier, which includes sets of leads comprising inner lead portions having two different lengths. Therefore, the package can be made thinner than in the case where three semiconductor elements are stacked sequentially. Accordingly, functions of the TCP can be improved and higher values can be added to the TCP more efficiently.

Fifth Embodiment

Figure 5A:
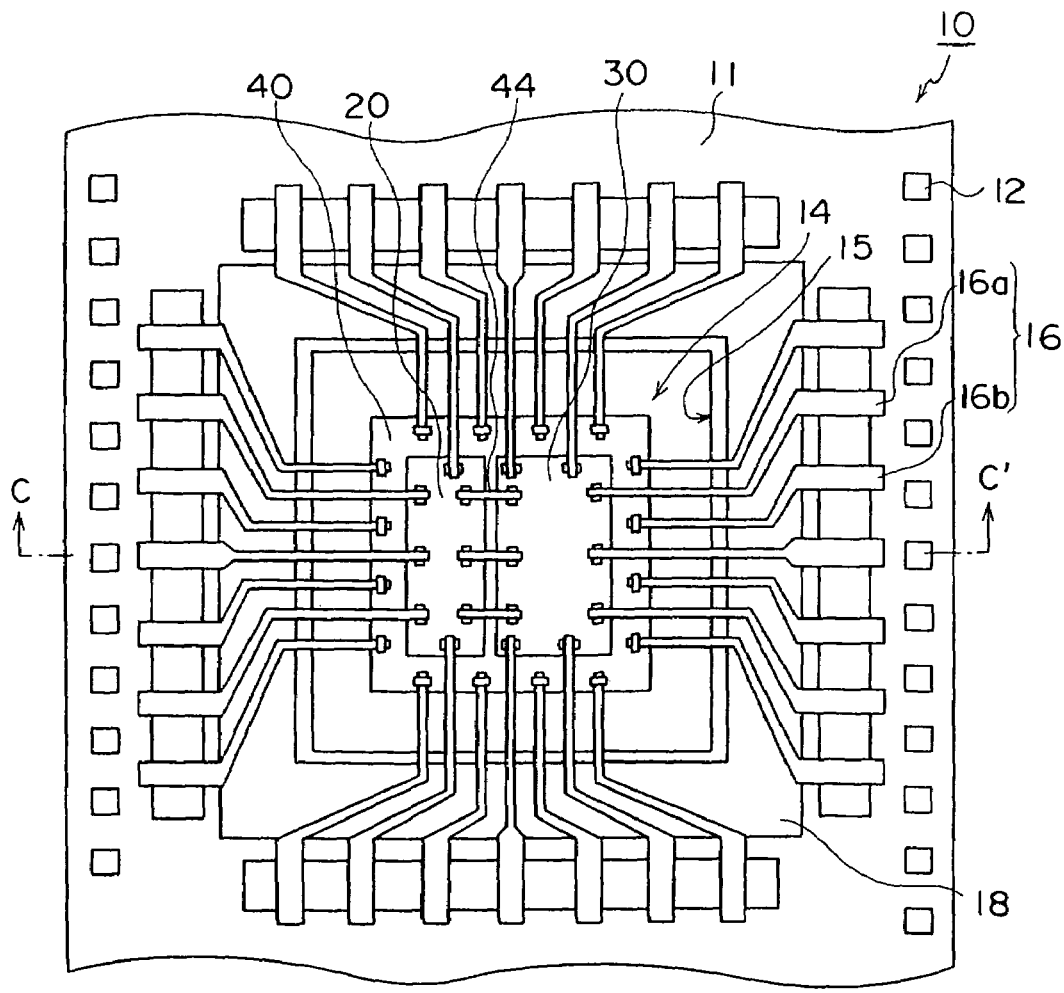
FIG. 5A is a plan view of a TCP of a fifth embodiment of the present invention.
Figure 5B:
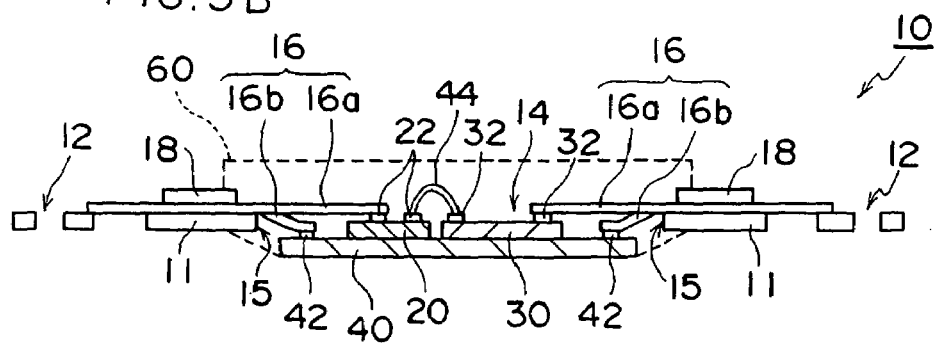
FIG. 5B is a sectional view taken along line C–C' of FIG. 5A.

FIGS. 5A and 5B schematically illustrate a fifth embodiment, which is a modified embodiment of the fourth embodiment. FIG. 5A is a plan view schematically illustrating an example of a TCP structure. FIG. 5B is a sectional view taken along line C–C' of FIG. 5A and seen from the direction indicated by arrows.

Hereinafter, the fifth embodiment of the present invention will be described with reference to FIGS. 5A and 5B.

A tape carrier and semiconductor elements mounted on the tape carrier shown in FIGS. 5A and 5B are based on the structure of the fourth embodiment, and is characterized in that the first and the second semiconductor elements 20 and 30 are connected by metal wires 44. Because the structures, the arrangements, and the connection relationships of the tape carrier 10, the first, second, and third semiconductor elements 20, 30, and 40 are similar to those described in connection with the fourth embodiment, explanation thereof will be omitted. Only characteristics unique to the fifth embodiment, namely, a provision of metal wires 44, will be described below.

The three semiconductor elements are mounted in a device hole 14. The first and second semiconductor elements 20 and 30 are mounted on the upper surface side of the third semiconductor element 40. The protruding electrodes 22 and 32 are disposed along the opposing edges of the first and second semiconductor elements 20 and 30, respectively. The metal wires 44 are bonded to the protruding electrodes 22 and 32. The protruding electrodes 22 and 32, which are disposed with the opposing edges of the first and the second semiconductor elements 20 and 30 interposed therebetween, are connected by the metal wires 44.

The metal wires 44 can be of any width and length, and can be made of any material as long as the objects of the present invention can be accomplished. However, from the viewpoint of fabrication process, it is preferable to select the width, length and material so that the same bonding device used for bonding the inner lead portions and the protruding electrodes of the semiconductor elements can also be used.

According to the fifth embodiment of the present invention, because the first and second semiconductor elements 20 and 30 are directly connected, packaging operation may be carried out quickly. Moreover, because two semiconductor elements may be made to cooperate in the package, the functions of the package can be even further improved.

Because the fabrication methods of the tape carrier 10 and the TCP of the present embodiment are substantially the same as those of the third embodiment, explanation thereof will be omitted. Only parts of the fabrication method which is unique to the TCP of the fifth embodiment will be explained below.

The first leads 16a are aligned with and bonded to the protruding electrodes 22 on the first semiconductor element 20 using a bonding device. Then, the second leads 16b are aligned with and bonded to the protruding electrodes 32 on the second semiconductor element 30 and the protruding electrodes 42 on the third semiconductor elements 40 using the bonding device. When the inner lead portions and the electrodes are aligned with each other, an adhesive, or the like, is applied in advance to the lower surface of the first semiconductor element 20 to adhere the first and second semiconductor elements 20 and 30 to the third semiconductor element 40.

The bonding of the metal wires 44 is preferably carried out, using a bonding device, when the semiconductor elements are being aligned with one another in the device hole 14. Alternately, the bonding of the metal wires 44 may be carried out after all the inner lead portions are bonded, or the three semiconductor elements may be adhered to one another before being mounted on the tape carrier, then the first and the second semiconductor elements 20 and 30 may be connected by the metal wires 44, and the stacked body of the semiconductor elements may be bonded to the inner lead portions. In this manner, the structure shown in FIGS. 5A and 5B is obtained.

Finally, the mold 60 is formed in the same manner as described in connection with the third embodiment.

Sixth Embodiment

Figure 6A:
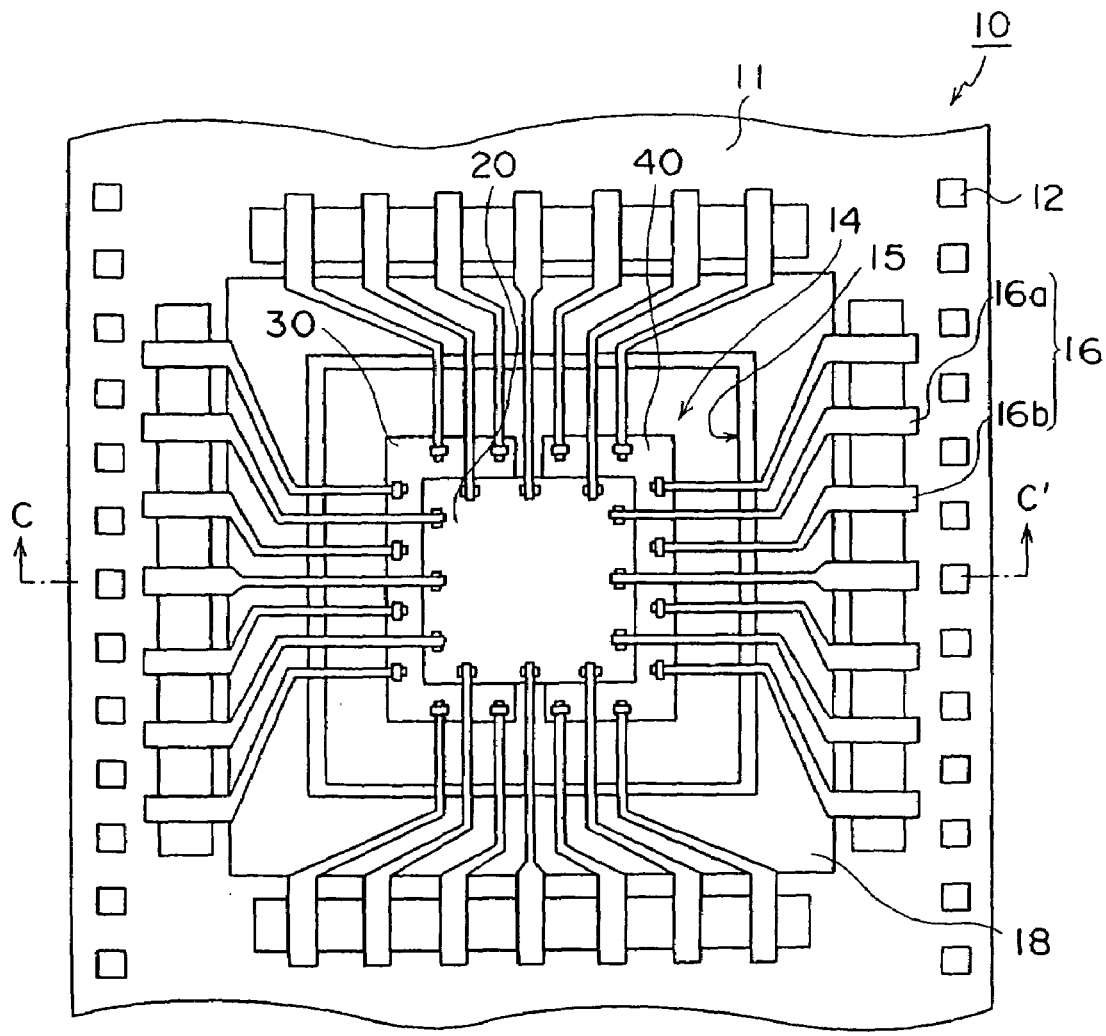
FIG. 6A is a plan view of a TCP of a sixth embodiment of the present invention.
Figure 6B:
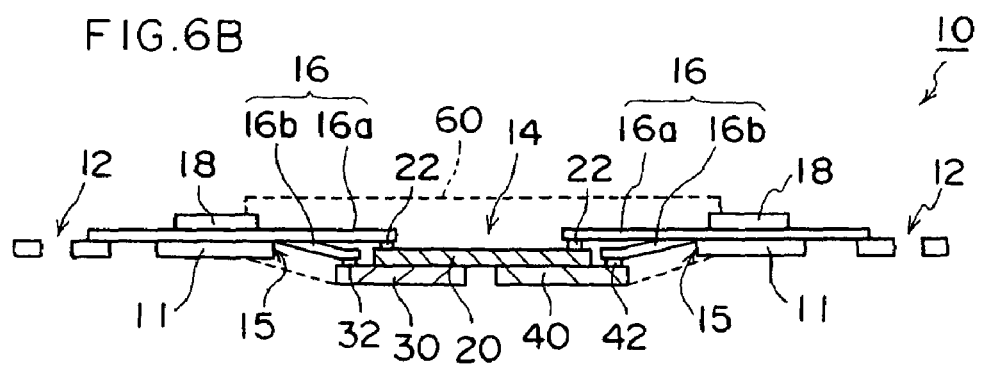
FIG. 6B is a sectional view taken along line C–C' of FIG. 6A.

FIGS. 6A and 6B schematically illustrate a sixth embodiment of the present invention. FIG. 6A is a plan view schematically illustrating a TCP structure having three semiconductor elements mounted on a tape carrier 10. FIG. 6B is a sectional view taken along line C–C' of FIG. 6A and seen from the direction indicated by arrows.

Hereinafter, the sixth embodiment of the present invention will be described with reference to FIGS. 6A and 6B.

In the sixth embodiment, as in the case of the fourth embodiment, the tape carrier 10 includes the sets of leads 16, each set being composed of leads including the inner lead portions of two different lengths, i.e., the first lead 16a and the second lead 16b which is shorter than the first lead 16a. Several sets of the leads 16 are disposed parallel to one another on the base tape 11. Two sets of leads 16 are disposed along each of the four peripheral edges 15 of the device hole 14. The size and arrangement of the semiconductor elements mounted on the tape carrier 10 of the sixth embodiment are different from those of the fourth embodiment.

Each of the three semiconductor elements has a rectangular-parallelepiped shape. The upper and the lower surfaces of the first semiconductor element 20 have an identical square-shape. The thickness of the three semiconductor elements is identical. The length of the longer sides of the upper surface of the second semiconductor element 30 is equal to the length of the longer sides of the upper surface of the third semiconductor element 40. The second and the third semiconductor elements 30 and 40 are disposed parallel to but physically and electrically spaced apart from each other at the lower surface side of the first semiconductor element 20 so that the longer sides of the second and third semiconductor elements face each other.

In the present embodiment, the second and the third semiconductor elements 30 and 40 are mounted at the lower surface side of the first semiconductor element 20 so that their own functions are not impaired. The first semiconductor element 20 is mounted on the second and the third semiconductor elements 30 and 40, such that the first semiconductor element 20 does not contact the protruding electrodes 32 and 42 on the second and the third semiconductor elements 30 and 40 and form short circuits, thereby impairing the functions of the electrodes. Thus, it is preferable to mount the first semiconductor element 20 at the inner side of the bonding pads to which the inner lead portions of the second and the third semiconductor elements 30 and 40 are bonded. Here, it is preferable to adhere these three semiconductor elements to one another using an adhesive (not shown) to minimize the TCP thickness. That is, the bottom surface of the first semiconductor element 20 is adhered to the upper surfaces of the second and the third semiconductor elements 30 and 40 at an area where the functions of the semiconductor element do not impair one another. The distance between the second and the third semiconductor elements 30 and 40 can be varied in accordance with, for example, the size of the first semiconductor element 20. The thickness of the three semiconductor elements may be different from one another.

Each of the first leads 16a is bonded to the corresponding protruding electrode 22 on the first semiconductor element 20. Each of the second leads 16b is bonded to the corresponding protruding electrode 32 or 42 on the second or the third semiconductor element 30 or 40.

Because the fabrication methods of the tape carrier 10 of the present embodiment is substantially the same as those of the third embodiment, explanation thereof will be omitted. Only parts of the fabrication method which is unique to the TCP of the sixth embodiment will be explained below.

Each of the inner lead portion end portions of the first leads 16a in the device hole 14 and the corresponding first protruding electrode 22 of the first semiconductor element 20 are aligned with and bonded to each other using a bonding device. Then, each of the inner lead portion end portions of the second leads 16b and the corresponding second or the third protruding electrode 32 or 42 of the second or the third semiconductor element 30 or 40 are aligned with and bonded to each other using the bonding device. When the leads and the electrodes are aligned with each other, an adhesive, or the like, may be applied in advance to the lower surface of the first semiconductor element 20 to adhere the first semiconductor element 20 to the second and the third semiconductor elements 30 and 40. In this manner, the structure shown in FIGS. 6A and 6B is obtained.

Finally, the semiconductor elements are sealed by a mold formed of resin, or the like. At this time, in consideration of a heat dissipation property of the semiconductor elements, cost performance optimization resulting from savings of molding material, and the like, surfaces of one or more of the mounted semiconductor elements may be exposed. If semiconductor elements of different widths are mounted, surfaces of one or more of the semiconductor elements may be exposed in accordance with the total thickness of the stacked semiconductor elements.

With this structure, the same effects as those of the fourth embodiment can be achieved.

Seventh Embodiment

Figure 7A:
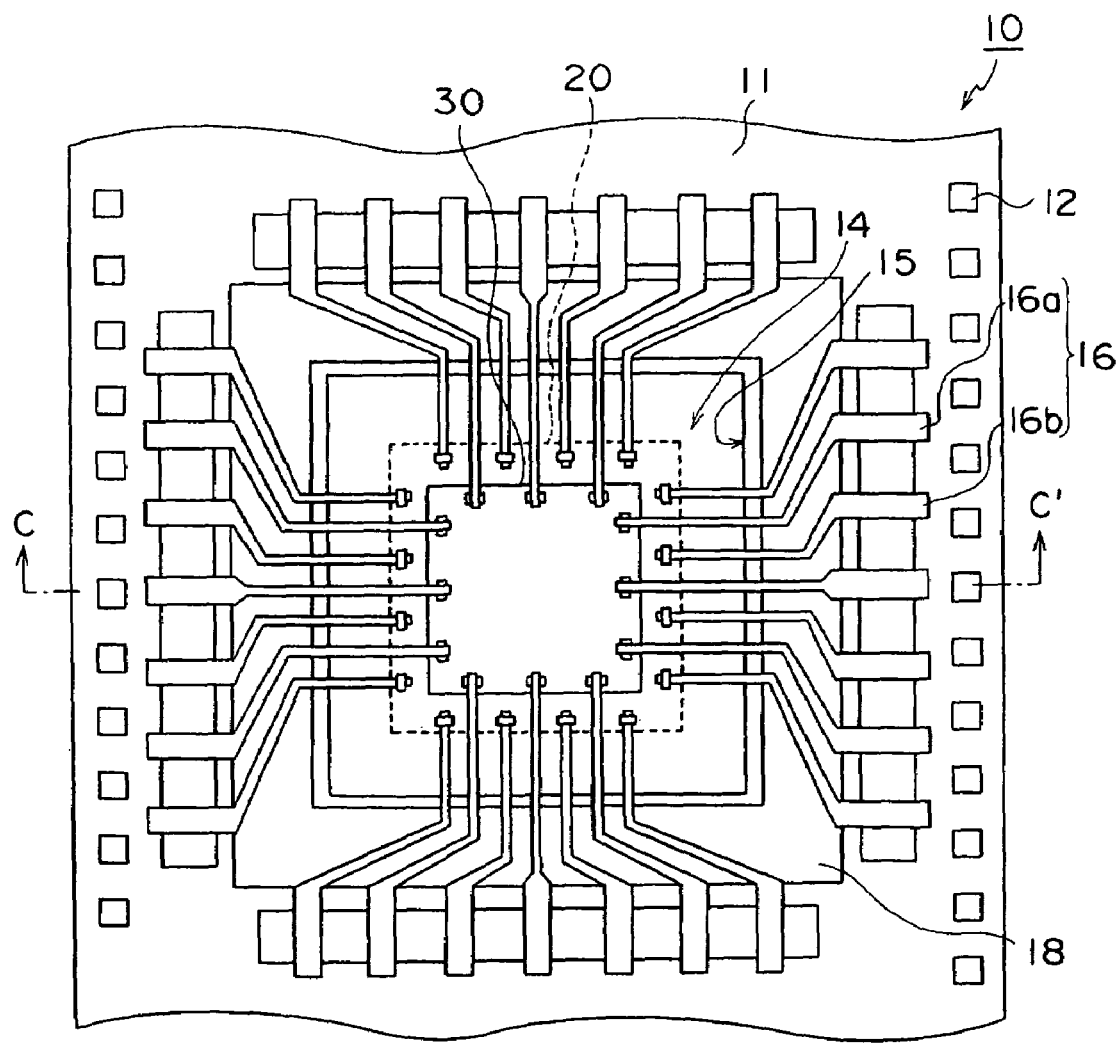
FIG. 7A is a plan view of a TCP of a seventh embodiment of the present invention.
Figure 7B:
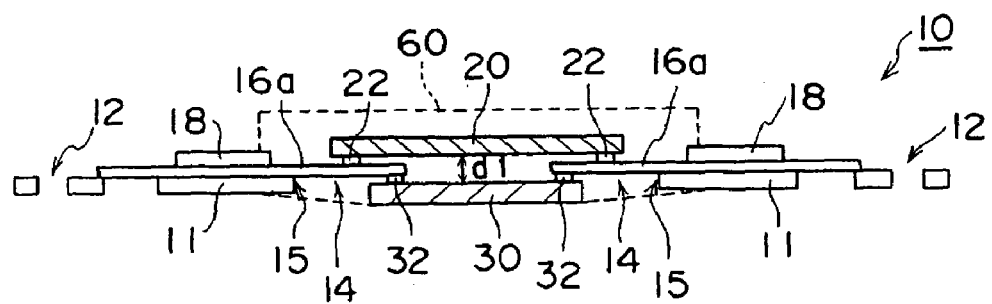
FIG. 7B is a sectional view taken along line C–C' of FIG. 7A.

FIGS. 7A and 7B schematically illustrate a seventh embodiment of the present invention. FIG. 7A is a plan view schematically illustrating a TCP structure having two semiconductor elements mounted on a tape carrier 10. Only outlines of the first semiconductor element 20 are shown in FIG. 7A to make this drawing of the arrangement and connections of the second semiconductor element 30 which is mounted under the first semiconductor element 20 simple and easy to understand. FIG. 7B is a sectional view taken along line C–C' of FIG. 7A and seen from the direction indicated by arrows.

Hereinafter, the seventh embodiment of the present invention will be described with reference to FIGS. 7A and 7B.

In the seventh embodiment, as in the case of the fourth and the sixth embodiments, the tape carrier 10 includes the sets of the leads 16, each set being composed of two leads, including inner lead portions of two different lengths, i.e., the first lead 16a and the second lead 16b which is shorter than the first lead 16a. Several sets of the leads 16 are disposed parallel to one another on the base tape 11. The number and arrangement of the semiconductor elements mounted on the tape carrier 10 of the seventh embodiment are different from those of the fourth and sixth embodiments.

In the tape carrier 10 of the present embodiment, two semiconductor elements, i.e., the first semiconductor element 20 and the second semiconductor element 30 are mounted in the device hole 14.

The first and second semiconductor elements 20 and 30 are of rectangular-parallelepiped shape. The upper and the lower surfaces of these semiconductor elements are square-shaped. These semiconductor elements have the same thickness. The dimensions of the upper surface of the first semiconductor element 20 are larger than those of the second semiconductor element 30.

The first protruding electrodes 22 are disposed on the lower surface of the first semiconductor element 20 along the outer peripheral edges thereof. The second protruding electrodes 32 are disposed on the upper surface of the second semiconductor element 30 along the outer peripheral edges thereof. Therefore, these semiconductor elements are mounted with the first protruding electrodes 22 and the second protruding electrodes 32 facing each other. That is, these semiconductor elements are oriented in opposite directions.

Lower surfaces of end portions of the first leads 16a are bonded to the protruding electrodes 32 provided on the upper surface of the second semiconductor element 30 in a so-called "face-down" manner. Upper surfaces of end portions of the second leads 16b are bonded to the protruding electrodes 22 provided on the lower surface side of the first semiconductor element 20 in a so-called "face-up" manner.

If the protruding electrodes contact each other, short circuits will be formed and the functions of the mounted semiconductor elements and thus the package itself will be impaired. To prevent this, the first and the second semiconductor elements 20 and 30 must be spaced apart from each other. In the present embodiment, the first and the second semiconductor elements 20 and 30 are spaced apart by a distance d1, whereby formation of short circuits between these semiconductor elements is prevented.

The semiconductor elements in the present embodiment may be of different thicknesses.

The fabrication methods of the tape carrier 10 of the present embodiment is substantially the same as those of the third embodiment, except that the sets of inner lead portions having two different lengths are optimally selected based on the semiconductor element to which the inner lead portions are to be bonded, so explanation of the fabrication methods of the tape carrier 10 will be omitted. Only a part of the fabrication method characteristic of the TCP of the seventh embodiment will be explained below.

Each of the inner lead portion end portions of the first leads 16a in the device hole 14 and the corresponding second protruding electrode 32 of the second semiconductor element 30 are aligned with and bonded to each other using a bonding device. Then, the tape carrier 10 is turned to have the reverse side up. Thereafter, each of the second leads 16b and the corresponding first protruding electrodes 22 of the first semiconductor element 20 are aligned with and bonded to each other using the bonding device. In this manner, the structure shown in FIGS. 7A and 7B is obtained.

Though the fabrication method of the present embodiment includes a step of turning the tape carrier 10, this step may be omitted by use of, for example, a device with which the inner lead portions may be bonded to the both sides of the tape carrier 10.

Finally, the semiconductor elements are sealed by a mold formed of resin, or the like. The mold 60 is formed such that the first and second semiconductor elements 20 and 30 are spaced apart by the distance d1.

As in the cases of the above-described embodiments, in consideration of heat dissipation properties of the semiconductor elements, cost performance optimization resulting from savings of molding material, and the like, surfaces of one or more of the semiconductor elements mounted on the tape carrier 10 may be exposed.

According to the structure of the seventh embodiment of the present invention, the protruding electrodes, i.e., the bonding pads, of the mounted semiconductor elements are protected inside the package. Therefore, the strength of the TCP against external impacts can be improved, whereby the functions of the TCP can be further improved as in the cases of the above-described embodiments, and the yields can be increased.

Eighth Embodiment

Figure 8:
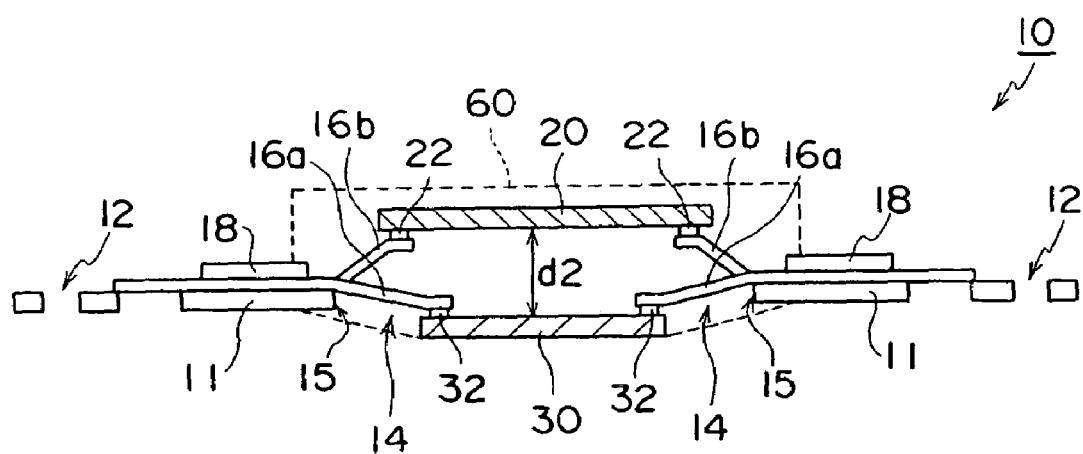
FIG. 8 is a sectional view of a TCP of an eighth embodiment of the present invention.

FIG. 8 is a sectional view schematically illustrating an eighth embodiment, which is a modified embodiment of the seventh embodiment. The plan view of the present embodiment is omitted because it is substantially the same as FIG. 7A.

In the eighth embodiment, as in the case of the seventh embodiment, the tape carrier 10 includes the sets of the leads 16. Each of the sets is composed of the two leads including the inner lead portions of two different lengths, i.e., the first lead 16a and the second lead 16b, which is shorter than the first lead 16a. Several sets of leads 16 are disposed parallel to one another on the base tape 11. The present embodiment differs from the seventh embodiment in that the first semiconductor element 20 and the second semiconductor element 30 are spaced apart from each other by a distance d2, and thus the lengths of the inner lead portions are optimally decided. The distance d2 of the present embodiment is larger than the distance d1 of the seventh embodiment (i.e., d1<d2). Preferably, the distance d2 is larger than the distance d1 as long as the TCP maintains the thinness.

The first semiconductor element 20 is slightly offset upward in the device hole 14. The second semiconductor element 30 is slightly offset downward in the device hole 14. Accordingly, the lengths of the first and the second leads 16a and 16b are optimally made rather long so that the leads 16a and 16b comprise length sufficient to form the offsets.

Since requirements for shape and arrangement of the semiconductor elements to be mounted are the same as those for the seventh embodiment, explanation thereof will be omitted.

The fabrication methods of the tape carrier 10 of the present embodiment is substantially the same as those of the seventh embodiment, except that the margins are included in the first and second inner lead portions 16a and 16b, so explanation thereof will be omitted. The fabrication methods of the TCP of the present embodiment is substantially the same as those of the seventh embodiment, except that the mold 60 is formed with the distance d2 being kept, so explanation thereof will also be omitted.

Although two of the semiconductor elements are mounted in the present embodiment, three or more of the semiconductor elements may also be mounted. In this case, a tape carrier 10 which includes sets of leads having three different lengths may be used. An unillustrated third semiconductor element may be adhered to the upper surface of the second semiconductor element 30 which is spaced apart from the first semiconductor element 20.

In the structure of the eighth embodiment, the distance between the opposing surfaces of the semiconductor elements becomes larger. Therefore, in addition to the effects achieved by the seventh embodiment, mutual interference between the semiconductor elements resulting from noise, or the like, generated by the semiconductor elements can be reduced. Accordingly, malfunctions, such as improper operations, of the semiconductor elements can be prevented.

Ninth Embodiment

Figure 9A:
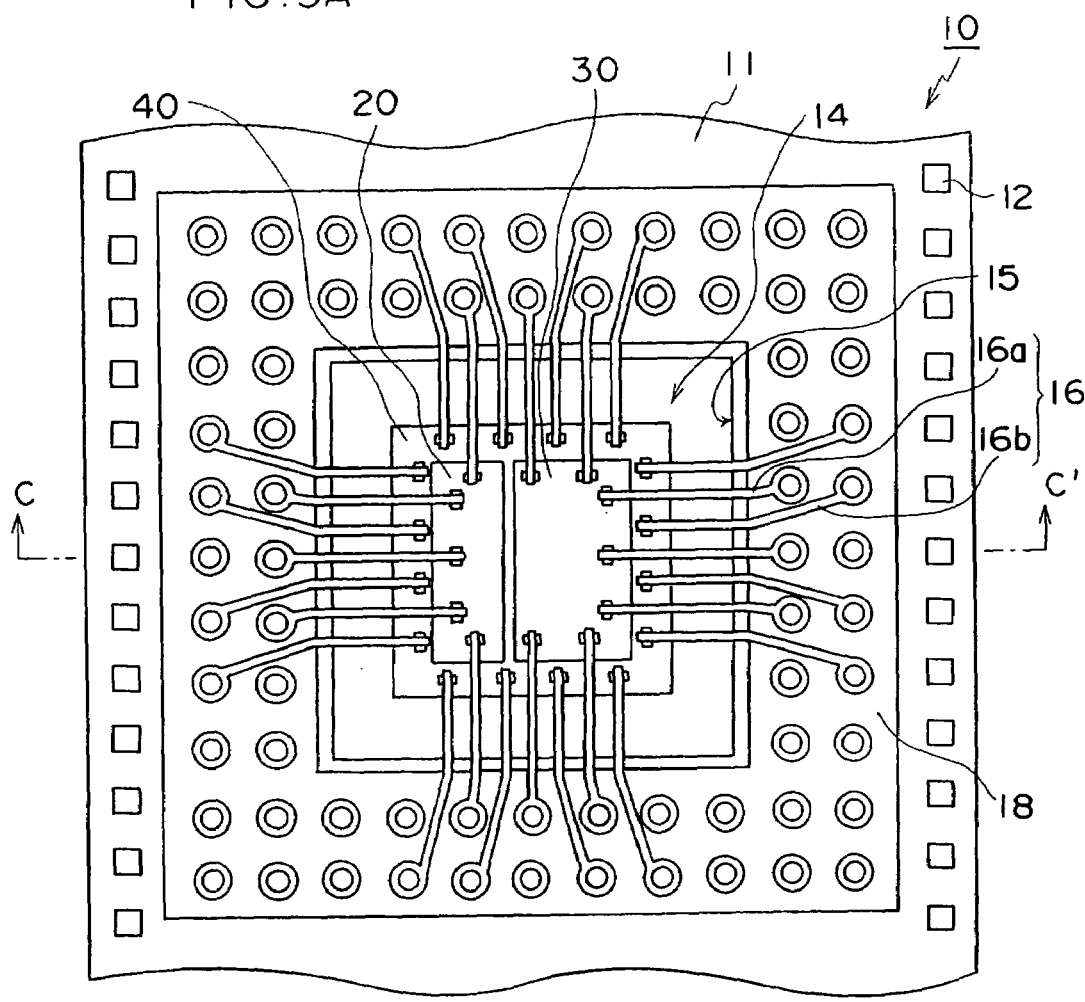
FIG. 9A is a plan view of a TCP of a ninth embodiment of the present invention.
Figure 9B:
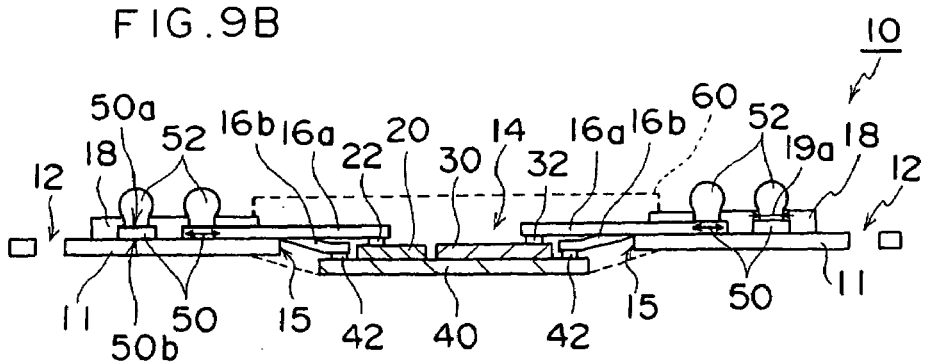
FIG. 9B is a sectional view taken along line C–C' of FIG. 9A.

FIGS. 9A and 9B schematically illustrate a ninth embodiment of the present invention. FIG. 9A is a plan view schematically illustrating a TCP structure having two semiconductor elements mounted on a tape carrier 10. FIG. 9B is a sectional view taken along line C–C' of FIG. 9A and seen from the direction indicated by arrows.

Hereinafter, the ninth embodiment of the present invention will be described with reference to FIGS. 9A and 9B. In the ninth embodiment, as in the case of, for example, the fourth embodiment, the tape carrier 10 includes the sets of the leads 16. Each of the set is composed of the first lead 16a and the second lead 16b, which is shorter than the first lead 16a. Several sets of the leads 16 are disposed parallel to one another on the base tape 11. Three semiconductor elements are mounted in a device hole 14. The present embodiment differs from the fourth embodiment in that outer lead portions of the leads 16 are formed as lands 50, to which metal balls 52, serving as electrodes, are connected. Therefore, the ninth embodiment relates to a tape carrier whose external connection terminals are formed as BGA.

The outer lead portions of the leads 16a are formed as lands 50 at areas where the metal balls 52, serving as external connection electrodes, can be connected. The lands 50 are arranged in a grid pattern and surround the device hole 14. The lands 50 are disposed on two concentric rectangles with the center of the device hole 14 being the center of concentricity equidistant from adjacent lands 50.

In the present embodiment, eleven lands 50 are disposed on each of the four sides of the outer concentric rectangle, and nine lands 50 are disposed on each of the four sides of the inner concentric rectangle. Thus, the present embodiment can also be considered as being fabricated in a manner that, the 11×11 lands 50 are disposed on the base tape 11 in a grid pattern, and then the device hole 14 is formed to have only the outermost two lines of lands 50. The total number of the lands 50 is larger than the total number of the leads 16. The outer lead portion side terminals of the first leads 16a that are opposite to the inner lead portion side are connected to the lands 50 disposed on the inner concentric rectangle. The second leads 16b are connected to the lands 50 disposed on the outer concentric rectangle. The metal balls 52, serving as electrodes, are connected to the lands 50. As in the cases of the above-described embodiments, the leads 16 are covered with and protected by a solder resist 18 within a range in which the leads 16 are on the base tape 11. That is, the base tape 11 is covered and protected by the solder resist 18 except the areas where the lands 50 and the metal balls 52 are disposed. The solder resist 18 includes openings 19a formed therein for exposing the upper surfaces 50a of the lands 50. To explain in more detail, the solder resist 18 may be formed by a screen masking method in which the solder resist 18 is applied selectively to the required portions, or by a method in which a photo solder resist is first applied to an entire surface, then exposed or etched so that the photo solder resist is left only at desired areas. The metal balls 52 are connected to the upper surfaces 50a of the lands 50 via the openings 19a. To explain in more detail, the metal balls 52 are first mounted on the lands 50 using a flux, then the metal balls 52 are connected to the lands 50 by re-flowing. The metal balls 52 protrude from the solder resist 18. The metal balls 52 are plated with metal, such as Au, solder, or the like. The TCP is mounted on, for example, a printed wiring board via the metal balls 52.

Although the configuration of the first and second leads 16a and 16b, the number, the size, and the arrangement of the semiconductor elements of the present embodiment are decided according to the fourth embodiment, the present invention is not limited to the same. The semiconductor elements of the ninth embodiment can be mounted on the tape carrier 10 in any manner as described in the foregoing embodiments and modified embodiments. For example, as shown in the third embodiment, sets of inner lead portions having three different lengths may be prepared and three semiconductor elements may be oriented in the same direction.

In the present embodiment, each lead 16 is connected to the closest land 50. However, the land 50 to which each lead 16 is connected can be selected freely as long as the lead 16 does not form short circuits with the other leads 16 or with the metal balls, and malfunctions, such as signal delays, do not occur.

According to the present embodiment, in addition to the effects achieved by the above-described embodiments, because leads of the outer lead portion side can be more freely connected, positions of terminals which output the output signal of the mounted semiconductor elements can be selected freely as long as troubles, such as short circuits or signal delays, do not occur.

The fabrication method of the tape carrier 10 and the TCP of the present embodiment are substantially the same as those of the above-described embodiments. Therefore, only the summary of the fabrication method of the TCP of the present embodiment will be given. If the lands 50 are formed in a conventional method, the solder resist may be formed such that the upper surfaces 50a of the lands 50 are exposed through the openings 19a.

With such a structure, the functions of the TCP can be further improved and higher values can be added to the TCP by mounting a plurality of the semiconductor elements. Further, the TCP can be mounted on, for example, a printed wiring board at the same time with other components by a method called "re-flowing." Therefore, the fabrication process of the TCP can be simplified, which helps to further reduce the manufacturing cost. The output positions of the output signals of the semiconductor elements mounted on the TCP can be allocated to the lands with certain degree of freedom.

Tenth Embodiment

Figure 10:
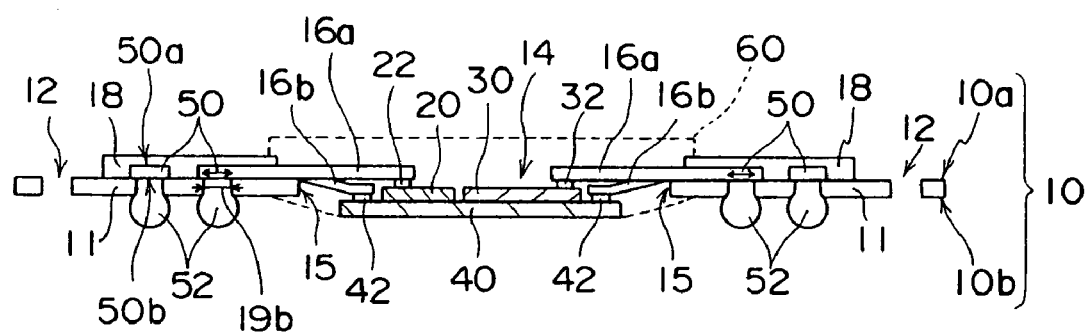
FIG. 10 is a sectional view of a TCP of a tenth embodiment of the present invention.

FIG. 10 schematically illustrates a tenth embodiment of the present invention. FIG. 10 is a sectional view of a TCP structure having three semiconductor elements mounted on a tape carrier 10.

The plan view of the tape carrier 10 is substantially the same as FIG. 9A except that the solder resist 18 covers the lands 50 and no openings 19a are provided, so an explanation thereof will be omitted.

Hereinafter, the tenth embodiment of the present invention will be described with reference to FIG. 10. In the tenth embodiment, as in the case of the ninth embodiment, the tape carrier 10 includes the sets of the leads 16, each of the sets being composed of the first lead 16a and the second lead 16b which is shorter than the first lead 16a. Several sets of the leads 16 are disposed parallel to one another on the base tape 11. Three semiconductor elements are mounted in a device hole 14. The outer lead portions of the leads 16 are formed as lands 50, which are connected to metal balls 52, serving as electrodes. The present embodiment differs from the ninth embodiment in that the metal balls 52 are provided at a lower surface 10b side of the tape carrier 10.

The tenth embodiment will be described only in connection to differences thereof with the ninth embodiment. The upper surfaces 50a of the lands 50 are covered with the solder resist 18. When seen from the lower surface 10b side of the tape carrier 10, the base tape 11 includes openings 19b which pass through lower surfaces 50b of the lands 50. The metal balls 52 are connected from beneath the base tape 11, i.e., connected at the lower surface 10b side of the tape carrier 10 through the openings 19b.

Because a structure of the tape carrier 10 and a manner in which the semiconductor elements are mounted on the tape carrier 10 in the tenth embodiment are substantially the same as those of the ninth embodiment, explanation thereof will be omitted.

Although the configuration of the first and second leads 16a and 16b, the number, the size, and the arrangement of the semiconductor elements of the present embodiment are decided according to the ninth embodiment, the present invention is not limited to the same. The semiconductor elements of the tenth embodiment can be mounted on the tape carrier 10 in any manner as described in all of the foregoing embodiments and modified embodiments.

In the present embodiment, in consideration of signal delays, or the like, it is preferable to connect each lead 16 to the closest land 50. However, the land 50 to which each lead 16 is connected can be selected freely as long as the lead 16 does not form short circuits with other leads 16 or with the metal balls.

The fabrication method of the tape carrier 10 and the TCP of the present embodiment is substantially the same as those of the above-described embodiments. Therefore, only the summary of the fabrication method of the TCP of the present embodiment will be given. If the lands 50 are formed in a conventional method, the solder resist may be formed such that the upper surfaces 50a of the lands 50 are exposed through the openings 19a.

First, device holes 14 and sprocket holes 12 are formed on the base tape 11. The openings 19b are formed so that the lower surfaces 50b of the lands 50 are exposed at the lower surface 10b side of the tape carrier 10. Then, the lands 50 and the leads 16 which are connected to the lands 50 are formed by a conventional method. Thereafter, the solder resist 18 is provided. Finally, the metal balls 52 are connected to the lands 50 via the openings 19b.

According to the TCP structure of the tenth embodiment, in addition to the effects achieved by the ninth embodiment, because the direction in which the semiconductor elements are mounted on the tape carrier 10 (i.e., the downward direction) and the direction in which the metal balls 52 are connected are the same, an even thinner TCP may be obtained.

Eleventh Embodiment

Figure 11:
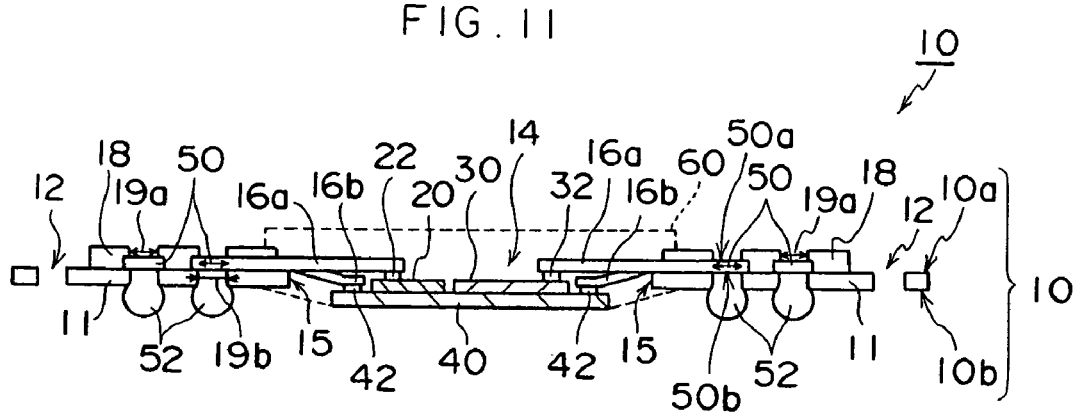
FIG. 11 is a sectional view of a TCP of an eleventh embodiment of the present invention.

FIG. 11 schematically illustrates an eleventh embodiment of the present invention. FIG. 11 is a sectional view of a TCP structure having three semiconductor elements mounted on a tape carrier 10.

The plan view of the present embodiment is substantially the same as FIG. 9A, except that the metal balls 52 are not connected to the openings 19a, so explanation thereof will be omitted.

Hereinafter, the eleventh embodiment of the present invention will be described with reference to FIG. 11. In the tape carrier 10 of the present invention, the openings 19a are further formed on a solder resist 18 at the upper surface 50a side of the lands 50 in the tape carrier 10 of the tenth embodiment. The metal balls 52 are connected to the lands 50 via the openings 19a. Thus, the present embodiment may be considered a combined form of the ninth and tenth embodiments, so detailed explanation thereof will be omitted.

The leads 16 of the eleventh embodiment are protected by the solder resist 18 within a range in which the leads 16 are on the base tape 11. That is, the base tape 11 is covered and protected by the solder resist 18 except the area where the upper surfaces 50a of the lands 50 are disposed. The solder resist 18 includes the openings 19a formed thereon for exposing the upper surfaces 50a of the lands 50. Further, as in the case of the tenth embodiment, openings 19b are formed on the base tape 11 through which the lower surfaces 50b of the lands 50 are exposed. The metal balls 52 are connected to the base tape 11 from beneath, i.e., connected at the lower surface 10b side of the tape carrier 10, which is the lower surface 50b side of the lands 50, through the openings 19b. Though the metal balls 52 are connected at the lower surfaces 50b side of the lands 50 in the present embodiment, the metal balls 52 may be connected to only the upper surfaces 50a or to both of the upper and lower surfaces (i.e., the upper and lower surfaces 50a and 50b).

Because the structure of the tape carrier 10 and the manner in which the semiconductor elements are mounted on the tape carrier 10 in the eleventh embodiment are substantially the same as those of the ninth embodiment, explanation thereof will be omitted.

Although the configuration of the first and second leads 16a and 16b, the number, the size, and the arrangement of the semiconductor elements of the present embodiment are decided according to the ninth embodiment, the present invention is not limited to the same. The semiconductor elements of the eleventh embodiment can be mounted on the tape carrier 10 in any manner described in the foregoing embodiments and modified embodiments.

In the present embodiment, in consideration of signal delays, or the like, it is preferable to connect each lead 16 to the closest land 50. However, the land 50 to which each lead 16 is connected can be selected freely as long as the lead 16 does not form short circuits with other leads 16 or with the metal balls.

According to the structure of the tape carrier 10 of the present embodiment, when the TCP using the tape carrier 10 is mounted on, for example, a printed wiring board, the metal balls 52, which are connected to the lands 50 exposed to the upper or lower surface 10a or 10b side of the tape carrier 10, may be surface mounted on the board. That is, when the tape carrier 10 is mounted on the substrate, the metal balls 52 may be selectively disposed on the upper surface 10a or the lower surface 10b of the tape carrier 10. Thus, the tape carrier 10 may be mounted on, for example, a printed wiring board, using both the sides thereof. As a result, the functions of the TCP can be further improved.

The fabrication method of the tape carrier 10 and the TCP of the present embodiment are substantially the same as those of the above-described embodiments. Therefore, only a part of the fabrication method characteristic of the TCP of the eleventh embodiment will be explained below.

First, device holes 14 and sprocket holes 12 are formed on the base tape 11. The openings 19b are formed so that the lower surfaces 50b of the lands 50 are exposed at the lower surface 10b side of the tape carrier 10. Then, the lands 50 and the leads 16 which are connected to the lands 50 are formed by a conventional method. Thereafter, the openings 19a are formed on the solder resist 18 so that the lands 50 are exposed therethrough. Finally, the metal balls 52 are connected to the lands 50 via the openings 19b on the base tape 11 or the openings 19a on the solder resist 18.

Twelfth Embodiment

Figure 12:
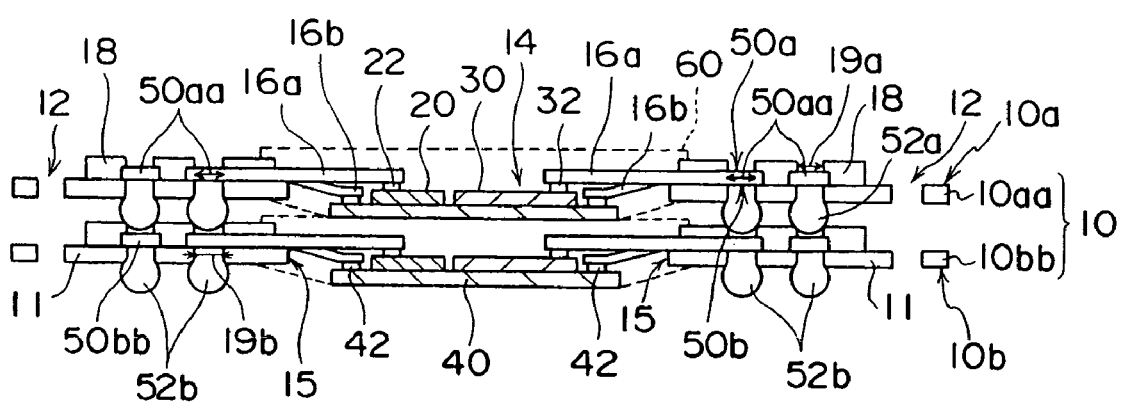
FIG. 12 is a sectional view of a TCP of a twelfth embodiment of the present invention.

FIG. 12 schematically illustrates a twelfth embodiment, which is an applied embodiment of the eleventh embodiment of the present invention. FIG. 12 is a sectional view of a TCP which is made up of two TCPs of the eleventh embodiment stacked in the vertical direction.

The plan view of the tape carrier 10 of the present embodiment is substantially the same as FIG. 9A, so explanation thereof will be omitted.

Hereinafter, the twelfth embodiment of the present invention will be described with reference to FIG. 12. Because the fabrication method of the tape carrier 10 and the TCP of the present embodiment are substantially the same as those of the eleventh embodiment, explanation thereof will be omitted.

In the present embodiment, the metal balls 52 of each of the two tape carriers 10 are connected to the tape carrier 10 from beneath via openings 19b of a base tape 11.

Metal balls 52a of the first tape carrier 10aa, which is the upper one of the two stacked TCPs, are connected to lands 50bb of the second tape carrier 10bb, which is the lower one of the two stacked TCPs, via the openings 19a formed in a solder resist 18 provided on the upper surface of the second tape carrier 10bb.

Although two TCPs are stacked in the present embodiment, three or more TCPs may be stacked as long as the objects of the present invention are met. As described in connection with the eleventh embodiment, metal balls 52a and 52*b* may be provided on the upper surfaces of the lands 50*aa* and 50*bb* of the two tape carriers 10*aa* and 10*bb* and the two tape carriers 10*aa* and 10*bb* may be stacked.

Although two identical TCPs are stacked in FIG. 12, the present invention is not limited thereto. Conditions, such as the lengths of the inner lead portions, the number of semiconductor elements to be mounted, and the manner in which the semiconductor elements are mounted, may be different between the two TCPs. In a case in which output signals are transferred directly from the upper TCP to the mounted board, metal balls may be provided on the lands of the intermediate TCP to conduct the upper TCP and the mounted board.

According to the structure of the present embodiment, output and input terminals of two or more of TCPs may be integrated on a mounting area of a single TCP and connected to the mounting board. Further, the semiconductor elements mounted on the separate tape carriers may be connected to each other. Accordingly, the functions of the TCP can be further improved within the same mounting area as those of conventional TCPs.

Thirteenth Embodiment

Figure 13A:
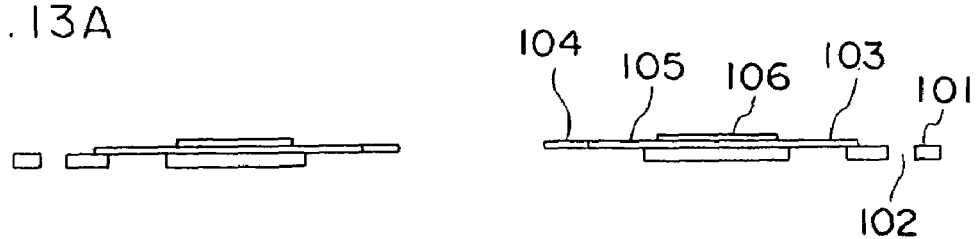
FIGS. 13A–13D are sectional views illustrating steps of fabricating a TCP of a thirteenth embodiment of the present invention.

A thirteenth embodiment relates to a fabrication method of the TCP of the first embodiment of the present invention. FIGS. 13A–13D are sectional views illustrating steps of a fabrication process of the thirteenth embodiment of the present invention. First, as shown in FIG. 13A, a tape carrier for the TCP is prepared. A base film 101 is made of polyimide, for example. Sprocket holes 102 are formed in the base film 101 for conveyance of the same. One end portion of each of the inner lead portions 104 and 105 includes a terminal 103 which is connected to an external substrate. At a bonding step, the other end portion of each of the inner lead portions 104 and 105 is bonded to a corresponding electrode on each semiconductor element. The inner lead portion 105 connected to electrodes 111 on a lower semiconductor element 107 is shorter than the inner lead portion 104 connected to electrodes 108 on an upper semiconductor element 107. The terminals 103 and the inner lead portions 104 and 105 are plated with Sn, Au or solder. A solder resist 106 is formed to protect the copper-made wiring pattern.

Figure 13B:
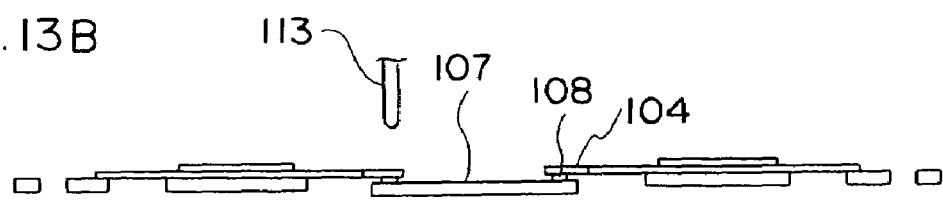

Next, as shown in FIG. 13B, the upper semiconductor element 107 is prepared. The protruding electrodes 108, formed on the upper semiconductor element 107, and the inner lead portions 104 are aligned with each other, and the inner lead portion 104 is bonded, one at a time, to the protruding electrode 108 using a bonding tool 113 by an ultrasonic thermo-compression bonding method, or the like.

Figure 13C:
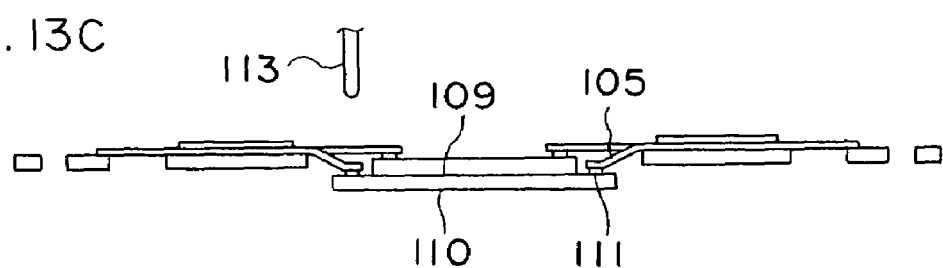

Then, as shown in FIG. 13C, a semiconductor element 110, having an adhesive applied to the upper surface thereof, is prepared. The protruding electrodes 111 and the inner lead portions 105 are aligned with each other, and the inner lead portion 105 is bonded, one at a time, to the protruding electrode 111 using a bonding tool 113 in the ultrasonic thermo-compression bonding method, or the like. Because the electrodes 111 on the lower semiconductor element 110 are disposed lower than the plane on which the inner lead portions 105 extend, the inner lead portions 105 are slightly bent downward. An adhesive 109 may be applied in advance to the back surface of the upper semiconductor element 107.

Figure 13D:
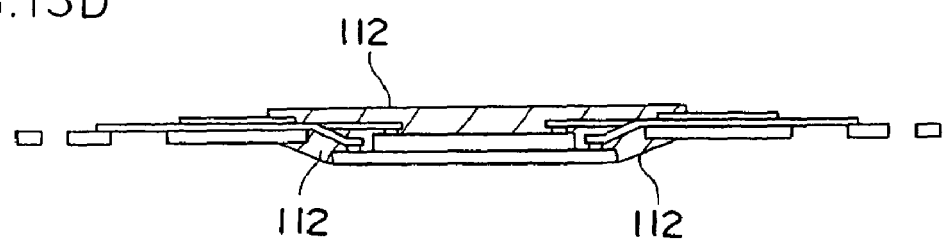

Finally, as shown in FIG. 13D, a sealing resin 112 seals the entire upper semiconductor element 107, side surfaces of the lower semiconductor element 110, the inner lead portions 104 and 105, a part of the solder resist 106 and a part of the base film 101 to protect the package. Thereafter, the sealing resin 112 is heated and cured (not shown). At the same time, the adhesive 109 is also heated and cured. In this manner, the TCP in which two semiconductor elements are stacked is formed.

Fourteenth Embodiment

Figure 14A:
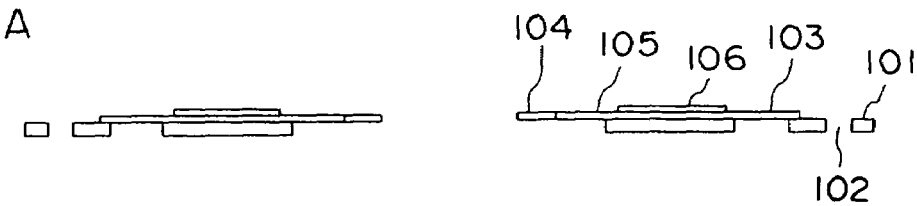
FIGS. 14A–14D are sectional views illustrating steps of fabricating a TCP of a fourteenth embodiment of the present invention.

A fourteenth embodiment relates to another fabrication method of the TCP of the first embodiment of the present invention. FIGS. 14A–14D are sectional views illustrating steps of fabrication process of the fourteenth embodiment of the present invention. First, as shown in FIG. 14A, a tape carrier for the TCP is prepared. A base film 101 is made of polyimide, for example. Sprocket holes 102 are formed on the base film 101 for conveyance of the base film 101. One end portion of each of the inner lead portions 104 and 105 is connected to a corresponding electrode on the semiconductor element. The other end portion of each of the inner lead portions 104 and 105 includes a terminal 103 which is connected to an external substrate. The inner lead portion 105 is shorter than the inner lead portion 104.

Figure 14B:
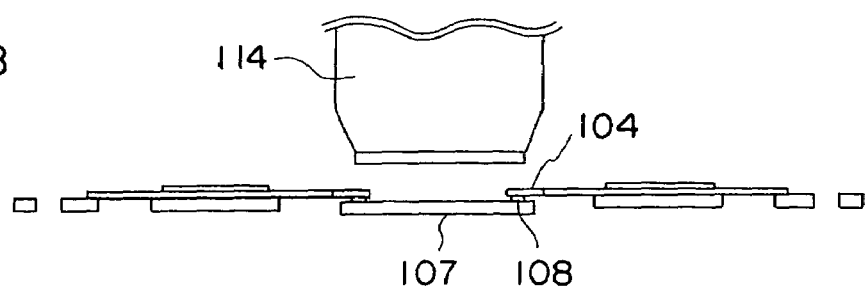

Next, as shown in FIG. 14B, an upper semiconductor element 107 is prepared. The protruding electrodes 108 and the inner lead portions 104 are aligned with each other, and all the inner lead portions 104 are bonded, at the same time, to the protruding electrodes 108 using a bonding tool 114 by the ultrasonic thermo-compression bonding method, or the like.

Figure 14C:
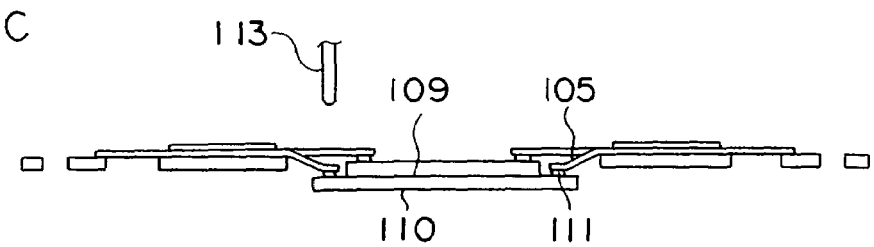

Then, as shown in FIG. 14C, a semiconductor element 110, having an adhesive applied to the upper surface thereof, is prepared. The protruding electrodes 111 and the inner lead portions 105 are aligned with each other, and the inner lead portion 105 is bonded, one at a time, to the protruding electrode 111 using a bonding tool 113 in an ultrasonic thermo-compression bonding method, or the like. An adhesive 109 may be applied in advance to the back surface of the upper semiconductor element 107.

Figure 14D:
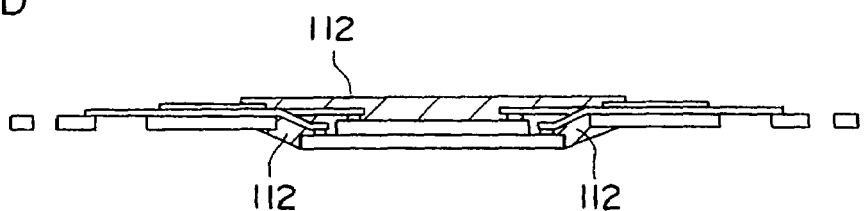
Figure 15A:
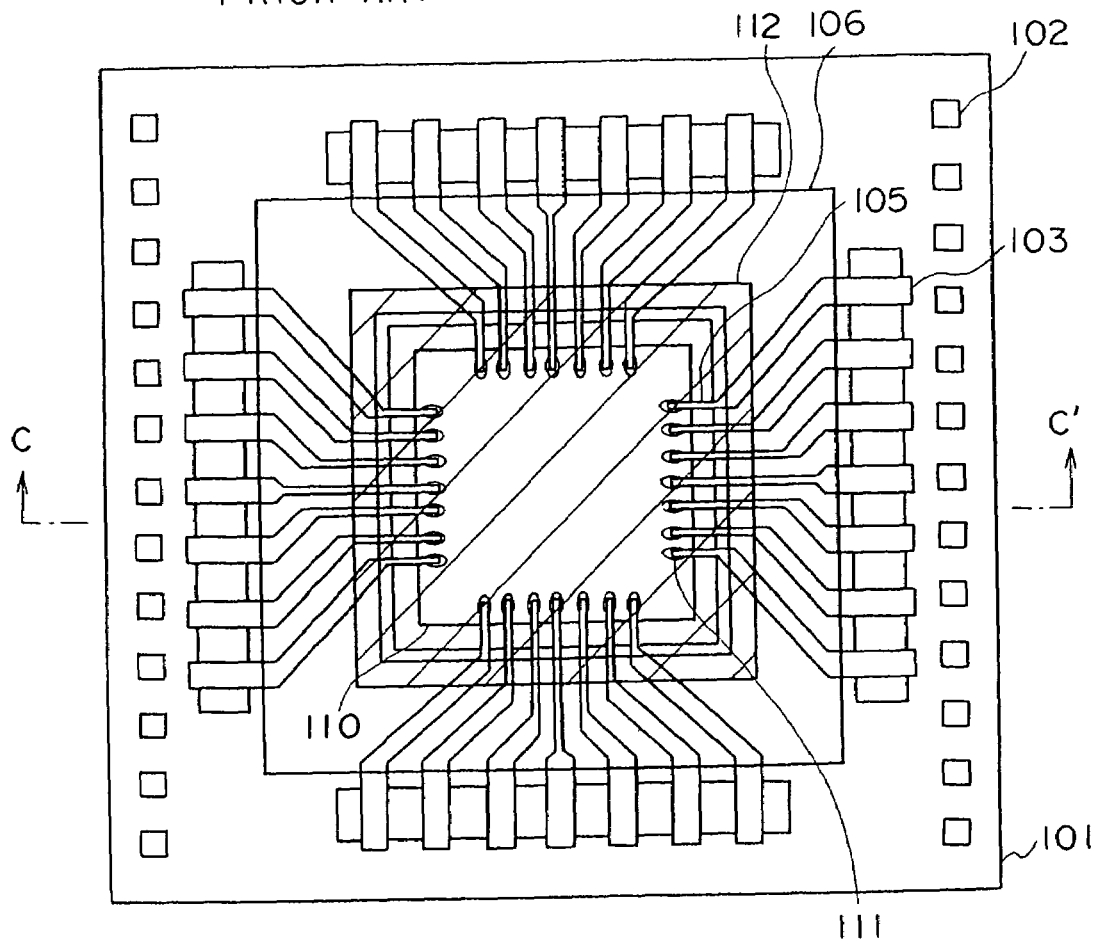
FIG. 15A is a plan view of a conventional TCP.
Figure 15B:
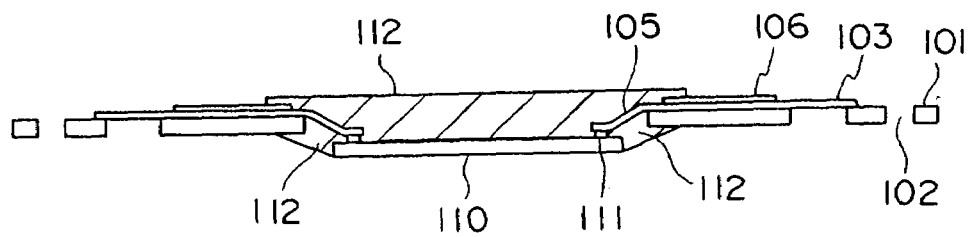
FIG. 15B is a sectional view taken along line C–C' of FIG. 15A.
Figure 16A:
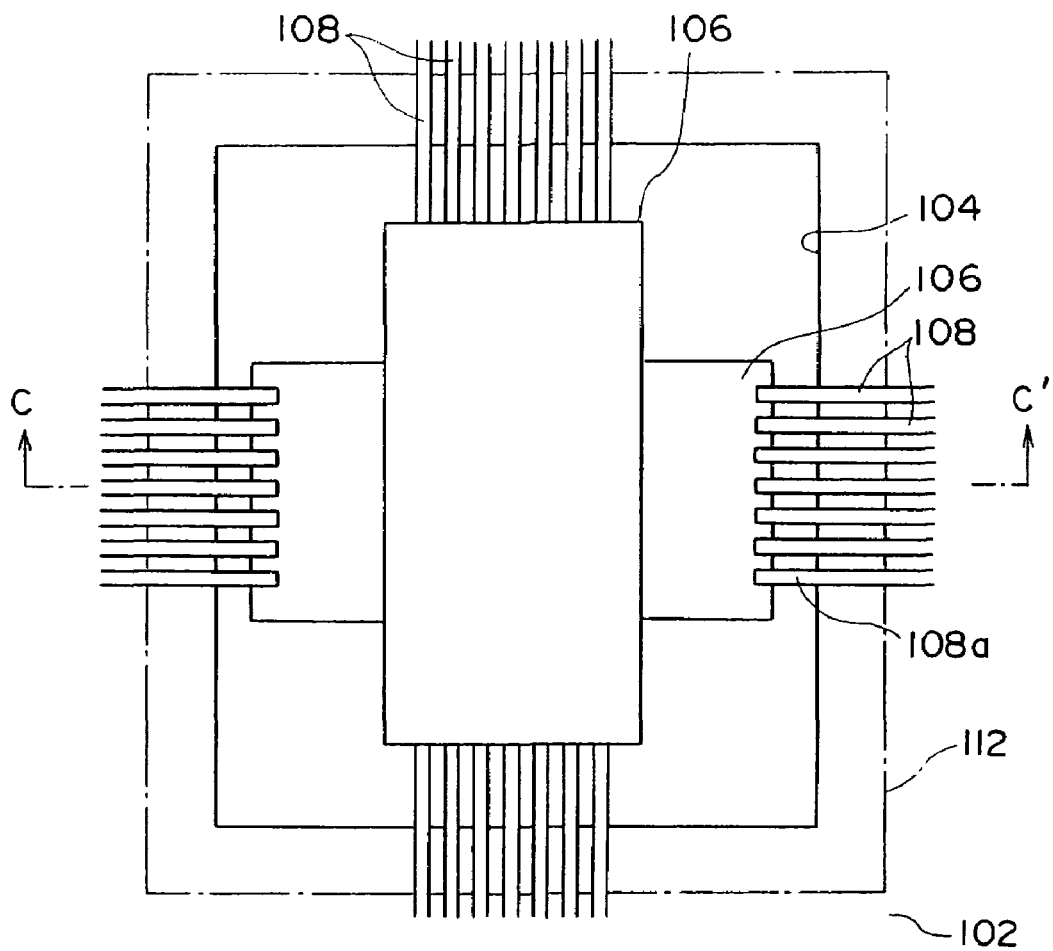
FIG. 16A is a plan view of another conventional TCP (disclosed in JP-A No. 5-21703).
Figure 16B:
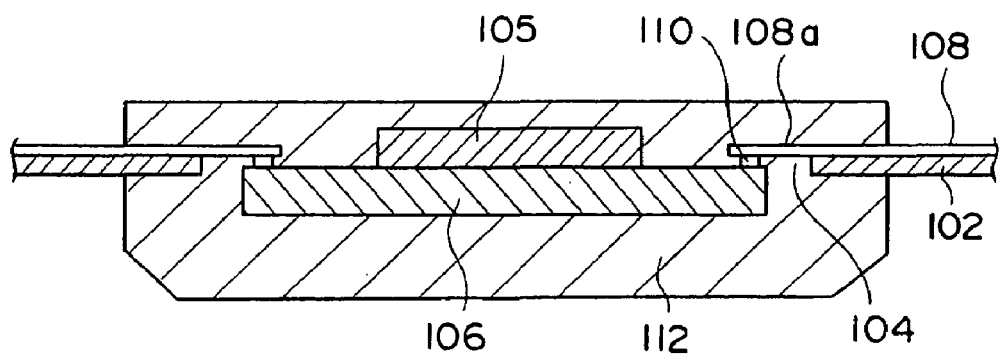
FIG. 16B is a sectional view taken along line C–C' of FIG. 16A.
Figure 17A:
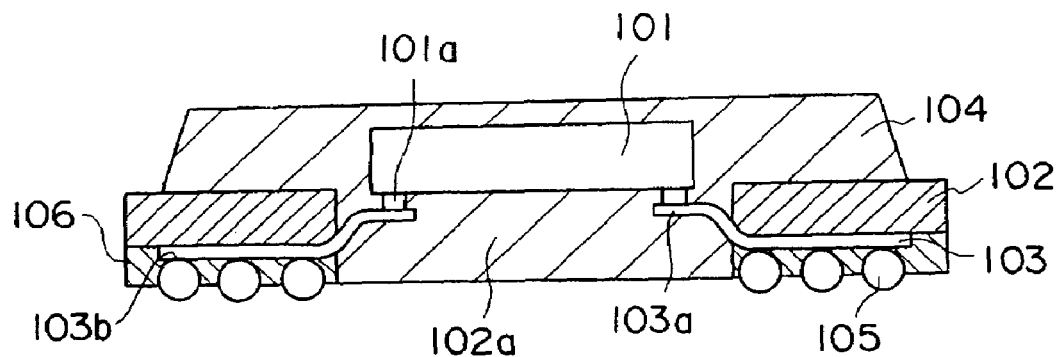
FIG. 17A is a sectional elevation of yet another conventional TCP (disclosed in JP-A No. 8-148526).
Figure 17B:
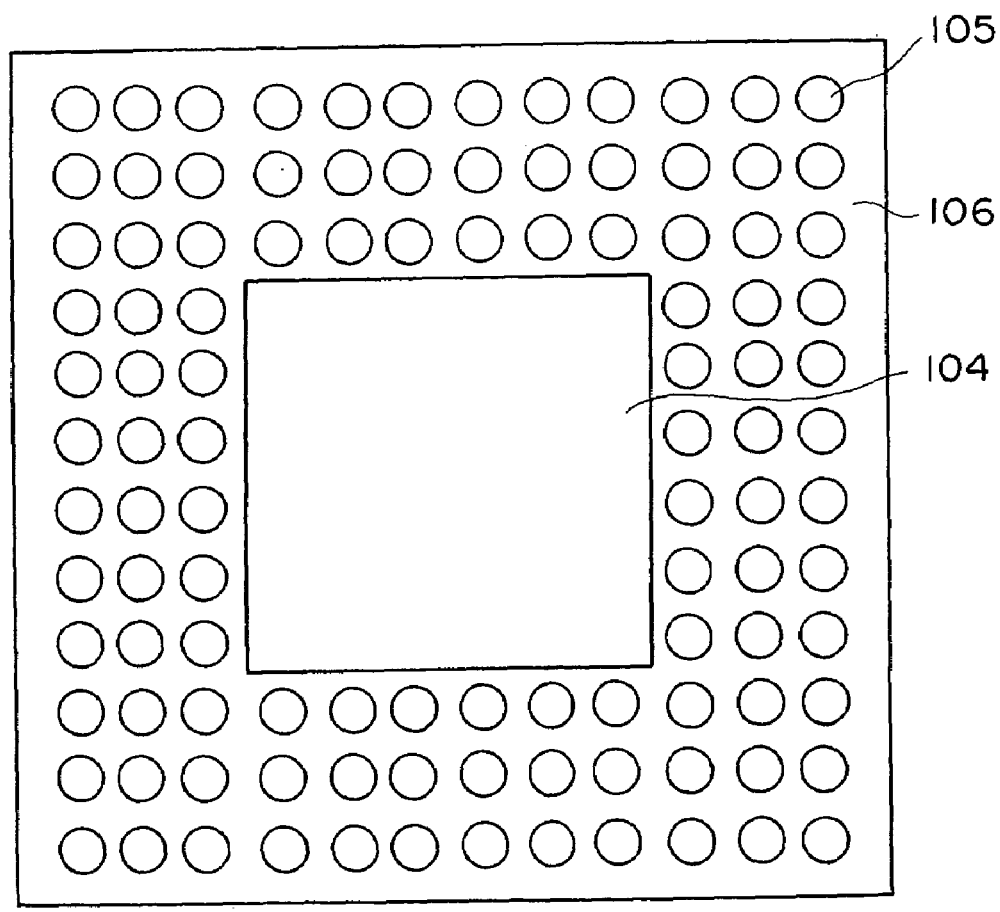
FIG. 17B is a bottom view of FIG. 17A.

Finally, as shown in FIG. 14D, a sealing resin 112 seals the entire upper semiconductor element 107, side surfaces of the lower semiconductor element 110, the inner lead portions 104 and 105, a part of the solder resist 106 and a part of the base film 101 to protect the package. Thereafter, the sealing resin 112 is heated and cured (not shown). At the same time, the adhesive 109 is also heated and cured. In this manner, the TCP in which two semiconductor elements are stacked is formed.

What is claimed is:

1. A semiconductor package comprising:
   a tape carrier;
   a first semiconductor element having a surface and a first electrode, on which surface the first electrode is provided;
   a longer lead having two ends and a first land, the one end being connected to the first electrode and the other end forming the first land on the tape carrier;
   a second semiconductor element having a surface and a second electrode, on which surface the second electrode is provided, and the first semiconductor element is stacked;
   a shorter lead having two ends and a second land, the one end being connected to the second electrode and the other end forming a second land on the tape carrier;
   a resin material which seals the first semiconductor element, the second semiconductor element, the longer lead and the shorter lead; and
   solder balls, which are mounted on the first and second lands for external connection.

2. A semiconductor package according to claim 1, further comprising at least another longer lead and at least another shorter lead, wherein each of the longer leads and each of the shorter leads are arranged so as to alternate with each other.

3. A semiconductor package according to claim 1, wherein the second semiconductor element is larger than the first semiconductor element, and comprises a surface area that faces the first semiconductor element and the second electrode is disposed outside said area.

4. A semiconductor package according to claim 1, wherein:
the first semiconductor element includes a first surface, on which the first electrode is formed, and a second surface, which is opposite the first surface;
the second semiconductor element includes a third surface, on which the second electrode is formed, and a fourth surface, which is opposite the third surface; and
the first semiconductor element and the second semiconductor element are stacked such that the second surface faces the third surface.

5. A semiconductor package according to claim 4, wherein the fourth surface is substantially devoid of the resin material, and the resin material is applied to substantially the remainder of the package.

6. A semiconductor package according to claim 1, wherein each of the second semiconductor element and the first semiconductor element has two sets of substantially parallel edges, and each of the longer and the shorter leads extends substantially orthogonally to each edge.

7. A semiconductor package according to claim 1, wherein the longer lead and the shorter lead extend outwardly in substantially the same plane.

8. A semiconductor package according to claim 4, wherein the second surface is adhered to the third surface.

9. A semiconductor package, comprising:
a tape carrier having a longitudinal extension and two side edges running parallel to the longitudinal extension;
a first semiconductor element mounted on the tape carrier between the two side edges;
a second semiconductor element mounted on the tape carrier between the two side edges;
a short lead provided on the tape carrier, and being connected to the first semiconductor element; and
a long lead provided on the tape carrier, and being connected to the second semiconductor element.

10. A semiconductor package recited in claim 9, wherein the second semiconductor element is disposed on the first semiconductor element.

11. A semiconductor package, comprising:
a tape carrier;
a first semiconductor element mounted on the tape carrier;
a second semiconductor element mounted on the tape carrier;
a short lead provided on the tape carrier, and being connected to the first semiconductor element; and
a long lead provided on the tape carrier, and being connected to the second semiconductor element;
wherein the second semiconductor element is disposed on the first semiconductor element;
wherein the first semiconductor element has a surface and a first electrode, on which surface the first electrode is provided;
wherein the long lead has two ends and a first land, the one end being connected to the first electrode and the other end forming the first land on the tape carrier;
wherein the second semiconductor element has a surface and a second electrode, on which surface the second electrode is provided, and the first semiconductor element is stacked; and
wherein the short lead has two ends and a second land, the one end being connected to the second electrode and the other end forming a second land on the tape carrier;
and wherein the semiconductor package further comprises a resin material which seals the first semiconductor element, the second semiconductor element, the longer lead and the shorter lead; and
solder balls, which are mounted on the first and second lands for external connection.

12. A semiconductor package according to claim 11, further comprising at least another longer lead and at least another shorter lead, wherein each of the longer leads and each of the shorter leads are arranged so as to alternate with each other.

13. A semiconductor package according to claim 11, wherein the second semiconductor element is larger than the first semiconductor element, and comprises a surface area that faces the first semiconductor element and the second electrode is disposed outside said area.

14. A semiconductor package according to claim 11, wherein:
the first semiconductor element includes a first surface, on which the first electrode is formed, and a second surface, which is opposite the first surface;
the second semiconductor element includes a third surface, on which the second electrode is formed, and a fourth surface, which is opposite the third surface; and
the first semiconductor element and the second semiconductor element are stacked such that the second surface faces the third surface.

15. A semiconductor package according to claim 14, wherein the fourth surface is substantially devoid of the resin material, and the resin material is applied to substantially the remainder of the package.

16. A semiconductor package according to claim 11, wherein each of the second semiconductor element and the first semiconductor element has two sets of substantially parallel edges, and each of the longer and the shorter leads extends substantially orthogonally to each edge.

17. A semiconductor package according to claim 11, wherein the longer lead and the shorter lead extend outwardly in substantially the same plane.

18. A semiconductor package according to claim 14, wherein the second surface is adhered to the third surface.

19. A semiconductor package according to claim 10, wherein:
the first semiconductor element has an upper surface and a first electrode, on which upper surface the first electrode is provided;
the short lead is connected to the first electrode;
the second semiconductor element has an upper surface and a second electrode, on which upper surface the second electrode is provided; and
the long lead is connected to the second electrode;
said semiconductor package further comprising:
a third semiconductor element having an upper surface and a third electrode, on which upper surface the third electrode is provided;
a further lead, which is shorter than the short lead, provided on the tape carrier and being connected to the third electrode; and a molding member, which seals the first semiconductor element, the second semiconductor element, the third semiconductor element, the first lead, the second lead and the third lead.

20. A semiconductor package according to claim 10, wherein the first semiconductor element has an upper surface and a first electrode, on which upper surface the first electrode is provided;
wherein the short lead is connected to the first electrode; and
wherein the second semiconductor element has an upper surface and a second electrode, on which upper surface the second electrode is provided;
the semiconductor package further comprising a third semiconductor element having an upper surface and a third electrode, on which upper surface the third electrode is provided, the third semiconductor element being disposed such that side surfaces of the first semiconductor element and the third semiconductor element are opposite each other and a space is formed therebetween;
a further short lead provided on the tape carrier and being connected to the third electrode; and
a molding member which seals the first semiconductor element, the second semiconductor element, the third semiconductor element, the long lead and the short leads, wherein
the lower surface of the second semiconductor element is adhered to both the upper surface of the first semiconductor element and the upper surface of the third semiconductor element.

21. A semiconductor package, comprising:
a tape carrier;
a first semiconductor element mounted on the tape carrier;
a second semiconductor element mounted on the tape carrier;
a short lead provided on the tape carrier, and being connected to the second semiconductor element; and
a long lead provided on the tape carrier, and being connected to the second semiconductor element;
wherein the second semiconductor element is disposed on the first semiconductor element;
wherein the tape carrier has a device hole, and lands which are arranged in a grid pattern;
wherein each lead has an outer lead portion and an inner lead portion, which outer lead portions are connected to the plurality of lands;
wherein a solder resist is provided on the lead which includes an opening through which the land is exposed;
wherein a metal ball is connected to the land via the opening; and
wherein the inner lead portions, which extend from a periphery of the device hole toward a center of the device hole, have several different lengths.

22. A semiconductor package according to claim 21, wherein the inner lead portions having different lengths are disposed regularly.

23. A semiconductor package, comprising:
a tape carrier;
a first semiconductor element mounted on the tape carrier;
a second semiconductor element mounted on the tape carrier;
a short lead provided on the tape carrier, and being connected to the first semiconductor element; and
a long lead provided on the tape carrier, and being connected to the second semiconductor element;
wherein the second semiconductor element is disposed on the first semiconductor element;
wherein the tape carrier has a device hole formed therein, a lower surface, and lands arranged in a grid pattern;
wherein openings are formed through which the lands are exposed to the lower surface side of the base tape;
wherein the leads have outer lead portions and inner lead portions, the outer lead portions being connected to the plurality of lands;
wherein a solder resist is provided on the leads;
wherein a metal ball is connected to the land via the opening; and
wherein the inner lead portions of the leads extend from a periphery of the device hole toward a center of the device hole and have several different lengths.

24. A semiconductor package according to claim 23, wherein the solder resist includes openings through which the upper surfaces of the lands are exposed.

25. A semiconductor package according to claim 23, wherein the inner lead portions are in sets of different lengths and are disposed at substantially regular intervals.

26. A semiconductor package according to claim 10, wherein the first semiconductor element has upper and lower surfaces and a first electrode, on which upper surface the first electrode is provided;
wherein the short lead is connected to the first electrode;
wherein the second semiconductor element has upper and lower surfaces and a second electrode, on which upper surface the second electrode is provided; and
wherein the long lead is connected to the second electrode;
the semiconductor package further comprising a third semiconductor element having an upper surface and a third electrode, on which upper surface the third electrode is provided, the second semiconductor element being disposed such that side surfaces of the second semiconductor element and the third semiconductor element are opposite each other, with a space formed therebetween, the second semiconductor element and the third semiconductor element being adhered to the upper surface of the first semiconductor element;
a further long lead which is connected to the third electrode; and
a molding member which seals the first semiconductor element, the second semiconductor element, the third semiconductor element, and the long leads and the short lead.

27. A semiconductor package recited in claim 9, wherein the tape carrier is sandwiched between the second semiconductor element and the first semiconductor element.

28. A semiconductor package recited in claim 27,
wherein the first semiconductor element has a lower surface, on which lower surface a first electrode is provided;
wherein the short lead is connected to the first electrode;
wherein the second semiconductor element has an upper surface, on which upper surface a second electrode is provided;
wherein the long lead is connected to the second electrode;
wherein a molding member seals the first semiconductor element, the second semiconductor element, and the long lead and the short lead; and
wherein the first semiconductor element is held so as to be spaced apart from the second semiconductor element.

* * * * *